United States Patent
Jyumonji et al.

(10) Patent No.: US 7,410,848 B2
(45) Date of Patent: Aug. 12, 2008

(54) CRYSTALLIZATION METHOD, CRYSTALLIZATION APPARATUS, PROCESSED SUBSTRATE, THIN FILM TRANSISTOR AND DISPLAY APPARATUS

(75) Inventors: Masayuki Jyumonji, Yokohama (JP);
Hiroyuki Ogawa, Yokohama (JP);
Masakiyo Matsumura, Yokohama (JP);
Masato Hiramatsu, Yokohama (JP);
Yoshinobu Kimura, Yokohama (JP);
Yukio Taniguchi, Yokohama (JP);
Tomoya Kato, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 202 days.

(21) Appl. No.: 10/878,331

(22) Filed: Jun. 29, 2004

(65) Prior Publication Data
US 2004/0266080 A1 Dec. 30, 2004

(30) Foreign Application Priority Data

| Jun. 30, 2003 | (JP) | ............................ 2003-189093 |
| Jul. 8, 2003 | (JP) | ............................ 2003-193779 |
| Sep. 1, 2003 | (JP) | ............................ 2003-308935 |
| Dec. 1, 2003 | (JP) | ............................ 2003-402197 |
| Mar. 26, 2004 | (JP) | ............................ 2004-093200 |

(51) Int. Cl.
*H01L 21/84* (2006.01)

(52) U.S. Cl. .................. 438/166; 257/E21.561
(58) Field of Classification Search ......... 438/151–166; 257/E21.561
See application file for complete search history.

(56) References Cited

U.S. PATENT DOCUMENTS 5,424,230 A * 6/1995 Wakai .................... 438/166
6,393,042 B1 * 5/2002 Tanaka ..................... 372/101
6,734,635 B2 * 5/2004 Kunii et al. .............. 315/169.3
2002/0047580 A1 4/2002 Kunii et al.

FOREIGN PATENT DOCUMENTS

CN 1407601 A 4/2003
JP 2003-178979 6/2003

OTHER PUBLICATIONS

Wenchang Yeh, et al., "Proposed Sample Structure for Marked Enlargement of Excimer-Laser-Induced Lateral Grain Growth in Si Thin Films", Jpn. J. Appl. Phys., vol. 41, Part 1, No. 4A, Apr. 2002, pp. 1909-1914.

M. Matsumura, "Advanced Laser-Crystallization Technologies of Si for High-Performance TFTs", The Ninth International Display Workshops (IDW'02) Proceedings, pp. 263-266.

(Continued)

*Primary Examiner*—Richard A. Booth
(74) *Attorney, Agent, or Firm*—Oblon, Spivak, McClelland, Maier & Neustadt, P.C.

(57) ABSTRACT

There are provided a crystallization method which can design laser beam having a light intensity and a distribution optimized on an incident surface of a substrate, form a desired crystallized structure while suppressing generation of any other undesirable structure area and satisfy a demand for low-temperature processing, a crystallization apparatus, a thin film transistor and a display apparatus. When crystallizing a non-single-crystal semiconductor thin film by irradiating laser beam thereto, irradiation light beam to the non-single-crystal semiconductor thin film have a light intensity with a light intensity distribution which cyclically repeats a monotonous increase and a monotonous decrease and a light intensity which melts the non-single-crystal semiconductor. Further, at least a silicon oxide film is provided on a laser beam incident surface of the non-single-crystal semiconductor film.

8 Claims, 23 Drawing Sheets

OTHER PUBLICATIONS

Masato Hiramatsu, et al., "Effect of Stacked Capping Layer for Phase-Modulated Excimer Laser Crystallization Method", Japan Society of Applied Physics, the 63rd academic lecture in autumn 2002, preliminary manuscript correction 2, pp. 779, 26a-G-2.

Minhong Lee, et al., "Relationship Between Fluence Gradient and Lateral Grain Growth in Spatially Controlled Excimer Laser Crystallization of Amorphous Silicon Films", Journal of Applied Physics, vol. 88, No. 9, Nov. 1, 2000, pp. 4994-4999.

Chang-Ho Oh, et al., "Optimization of Phase-Modulated Excimer-Laser Annealing Method for Growing Highly-Packed Large-Grains in Si Thin-Films", Applied Surface Science 154-155, 2000, pp. 105-111.

Satoshi Yoshimoto, et al., "A New Sample Structure for Position-Controlled Giant-Grain Growth of Silicon Using Phase-Modulated Excimer-Laser Annealing", Jpn. Appl. Phys., vol. 40, Part 1, No. 7, Jul. 2001, pp. 4466-4469.

Y. Sano, et al., "Highly Packed and Ultra-Large Si Grains Grown By a Single-Shot Irradiation of Excimer-Laser Light Pulse", Electrochemical Society Proceedings, vol. 2000-31, pp. 261-268.

Wen-Chang Yeh, et al., "Preparation of Giant-Grain Seed Layer for Poly-Silicon Thin-Film Solar Cells", Jpn. J. Appl. Phys., vol. 38, Part 2, No. 2A, Feb. 1, 1999, pp. L110-L112.

Chang-Ho Oh, et al., "Preparation of Position-Controlled Crystal-Silicon Island Arrays by Means of Excimer-Laser Annealing", Jpn. J. Appl. Phys., vol. 37, Part 1, No. 10, Oct. 1998, pp. 5474-5479.

Mitsuru Nakata, et al., "A New Nucleation-Site-Control Excimer-Laser-Crystallization Method", Jpn. J. Appl. Phys., vol. 40, Part 1, No. 5A, May 2001, pp. 3049-3054.

Yoshinobu Kimura, et al., "Microscopic Beam Profile and its Relationship With the Morphology of Poly-Si Film Grown Laterally by a Phase-Modulated Excimer-Laser Crystallization Method", 22nd Meeting of the Electrochemical Society (Salt Lake City, U.S.A.) (7 pgs), 2001.

M Jyumonji, et al., "High-Resolution Beam Profiler New Powerful Tool for Engineering Laterally-Grown Grain Morphology", IDW '02, pp. 1387-1388.

"Separate-Volume Flat Panel Display 1999", Nikkei Microdevices, Nikkei Business Publications, Inc., 1998, pp. 132-139.

Masakiyo Matsumura, "Silicon Thin Film Having Giant Crystal Grains and Formed by Light Irradiation Using Excimer Laser", Ouyobuapplied Surface Science 154-155 (2000), pp. 543-547.

Kohki Inoue, et al., "Amplitude and Phase Modulated Excimer-Laser Melt-Regrowth Method of Silicon Thin-Films a New Growth Method of 2-D Position-Controlled Large-Grains", Ouyobuapplied Surface Science 154-155, C vol. J85-C, No. 8, 2002, pp. 624-629.

* cited by examiner

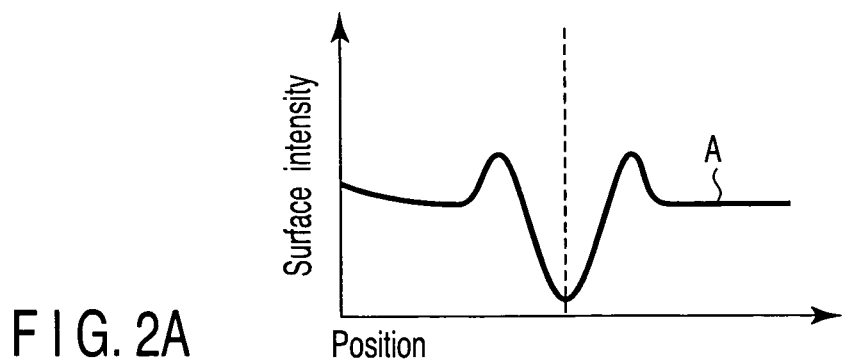
F I G. 2A
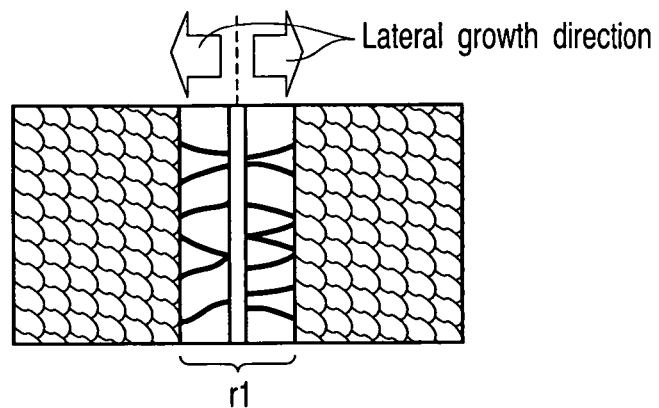
F I G. 2B
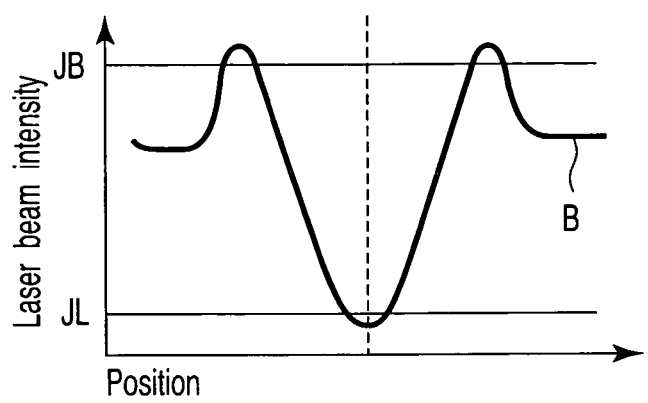
F I G. 2C
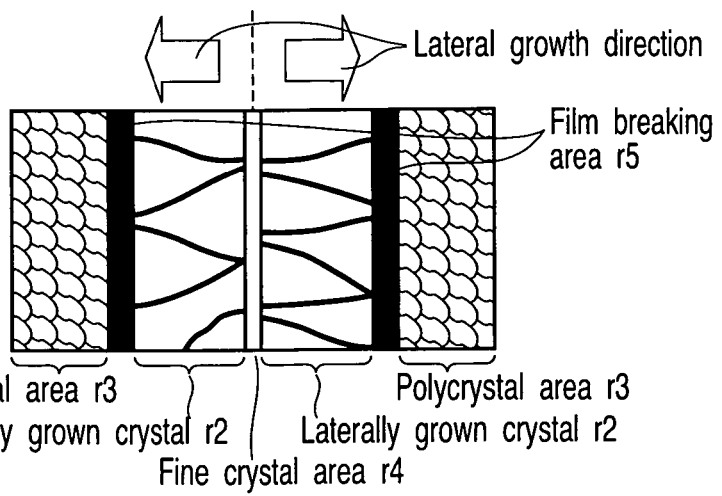
F I G. 2D

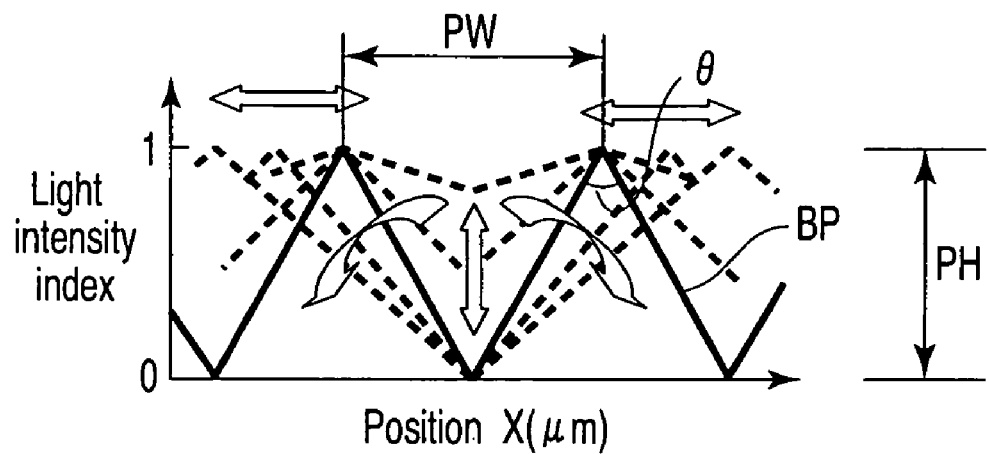
F I G. 14A
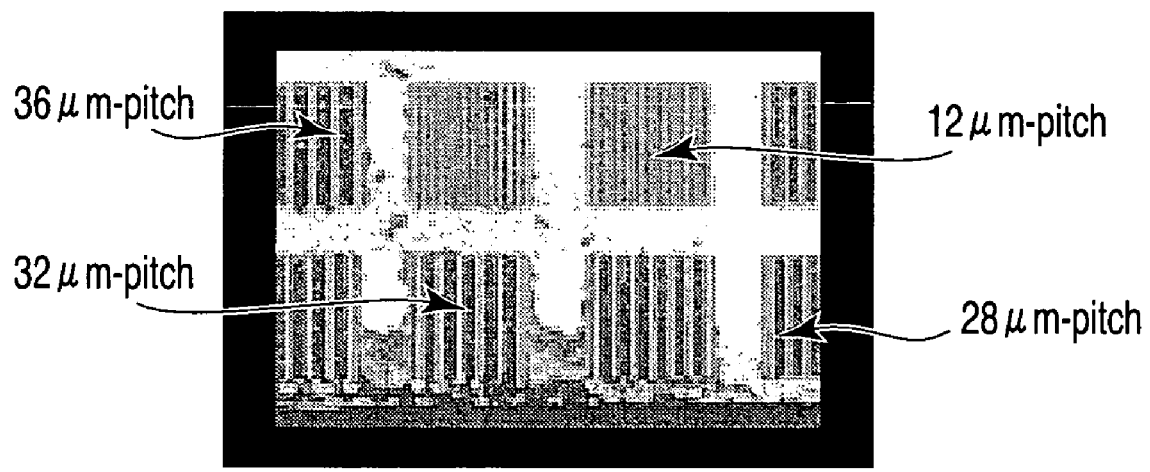
F I G. 14B

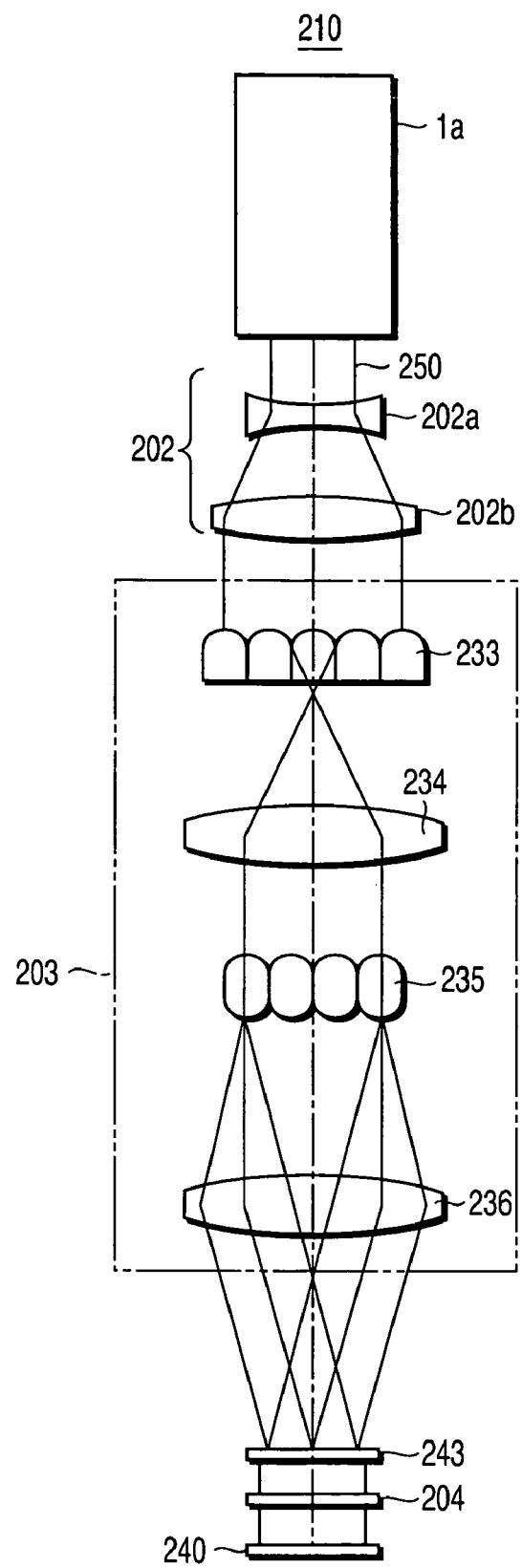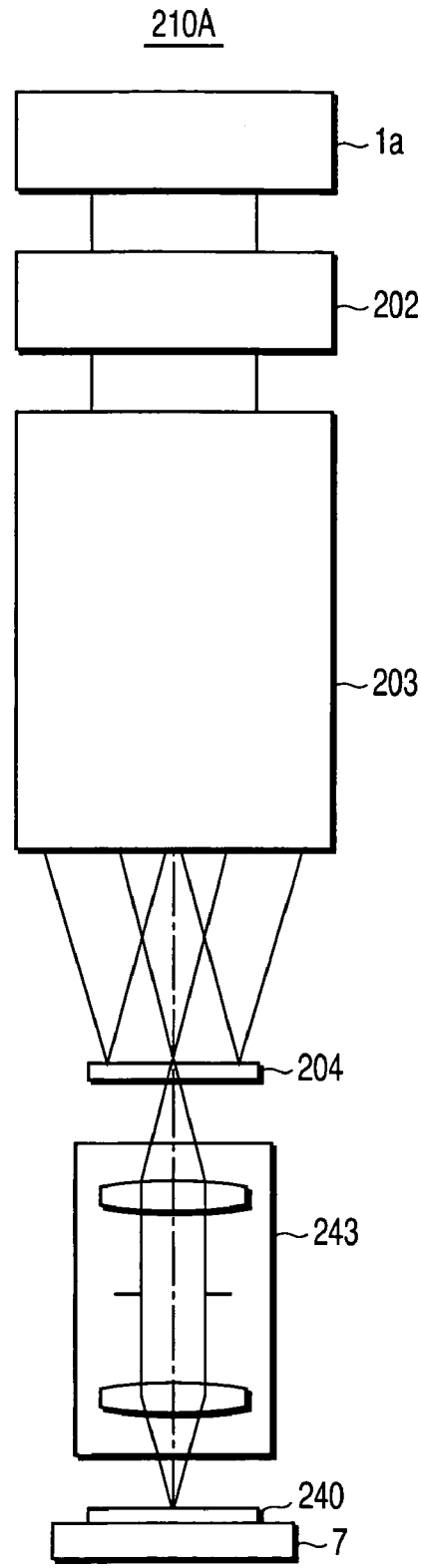
F I G. 16   F I G. 22

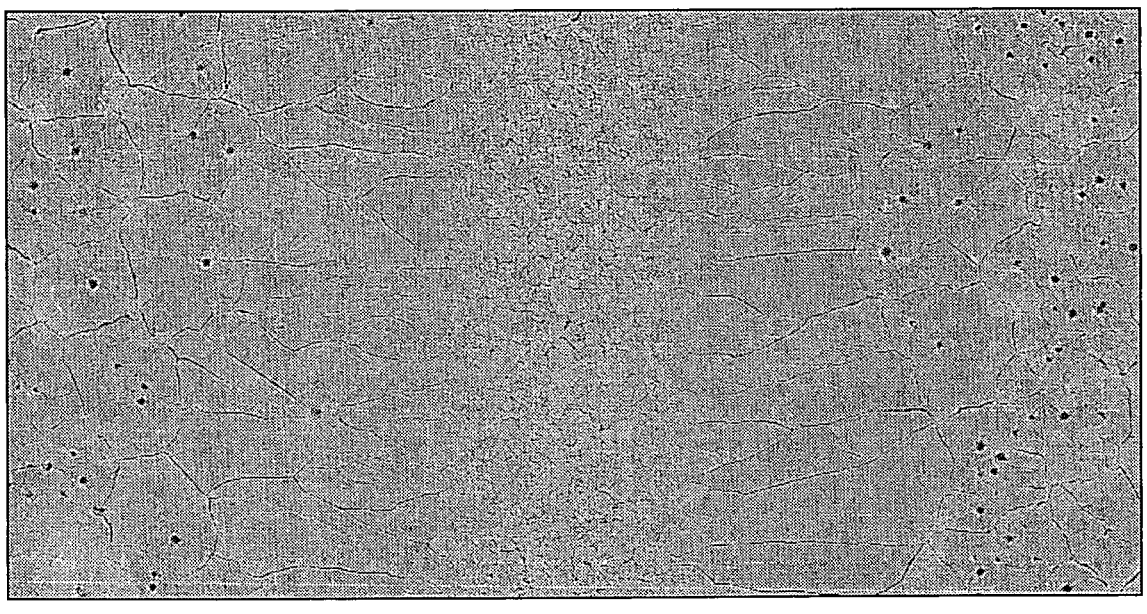
5μm
SEM photograph of crystallized Si sample at room temperature
(after Secco-etching)
F I G. 18

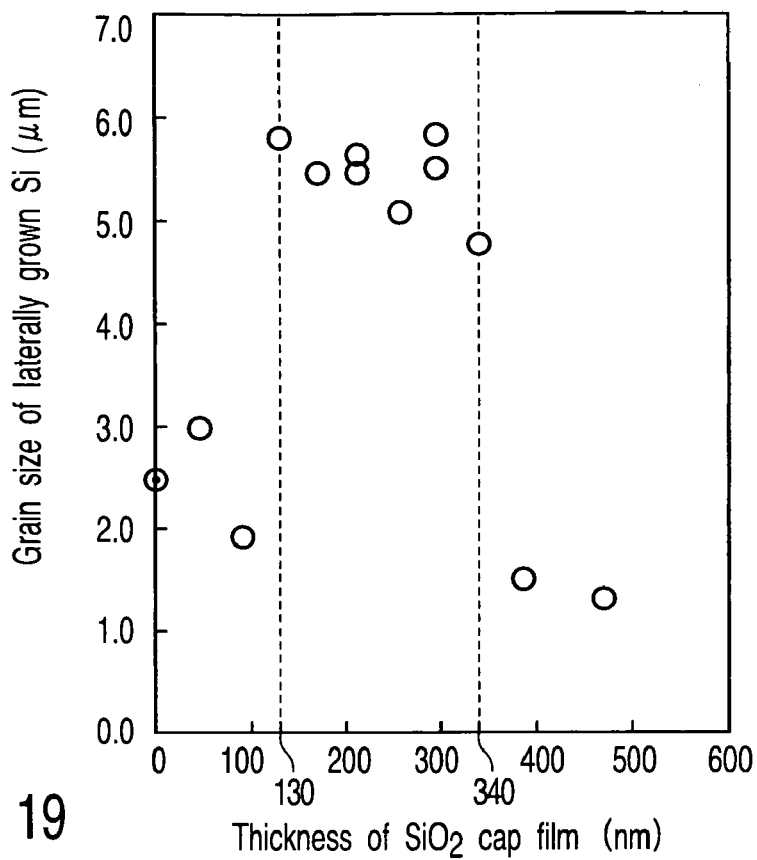
F I G. 19
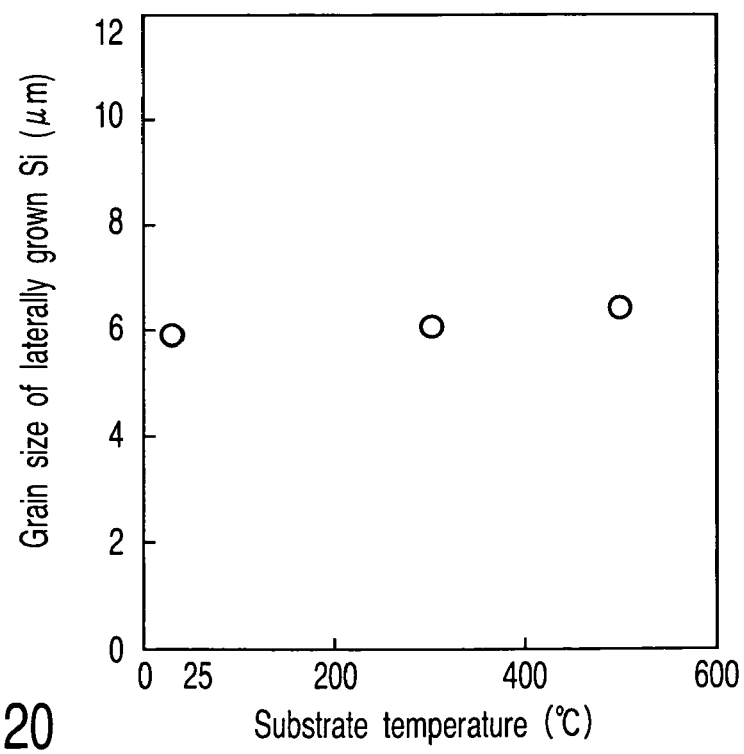
F I G. 20

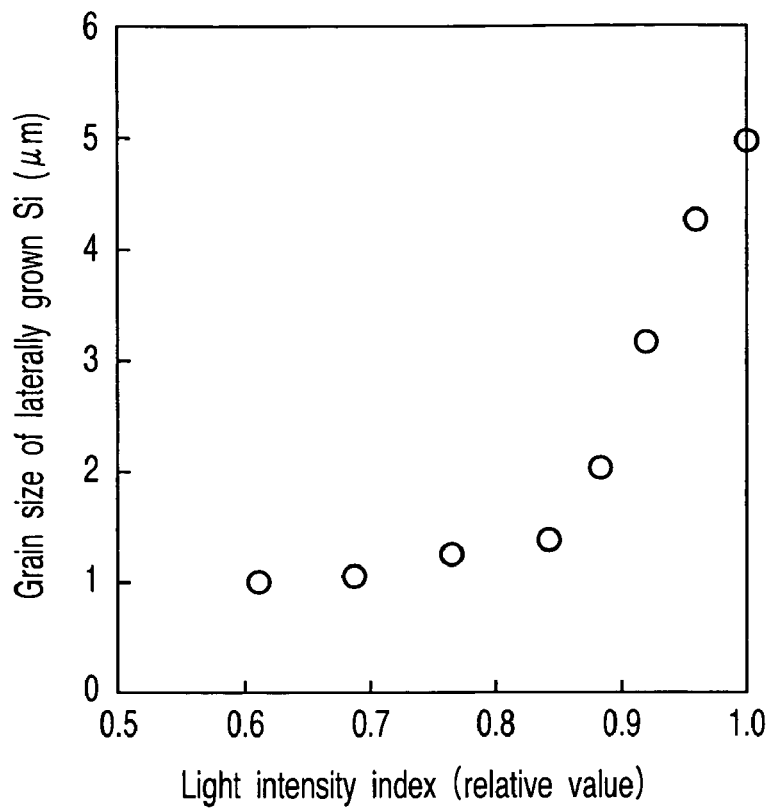
F I G. 21
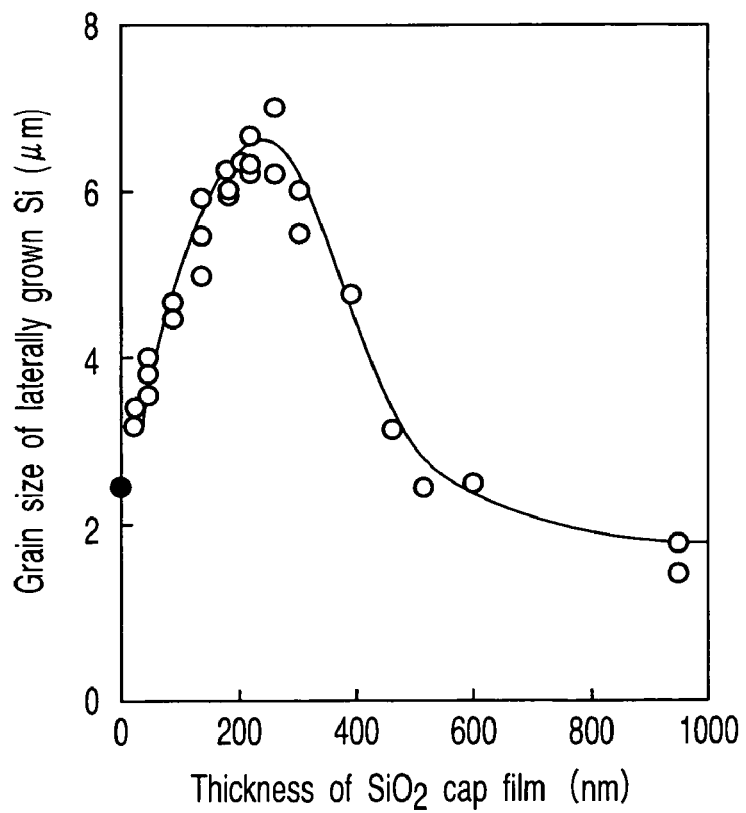
F I G. 23

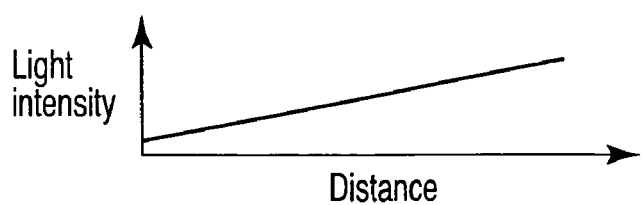
F I G. 26A
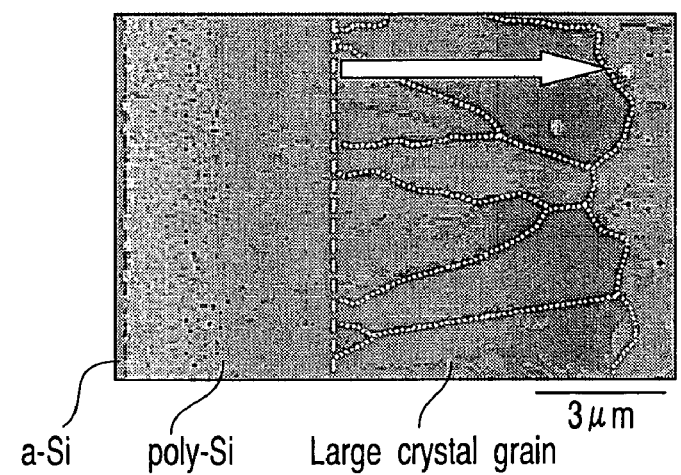
F I G. 26B
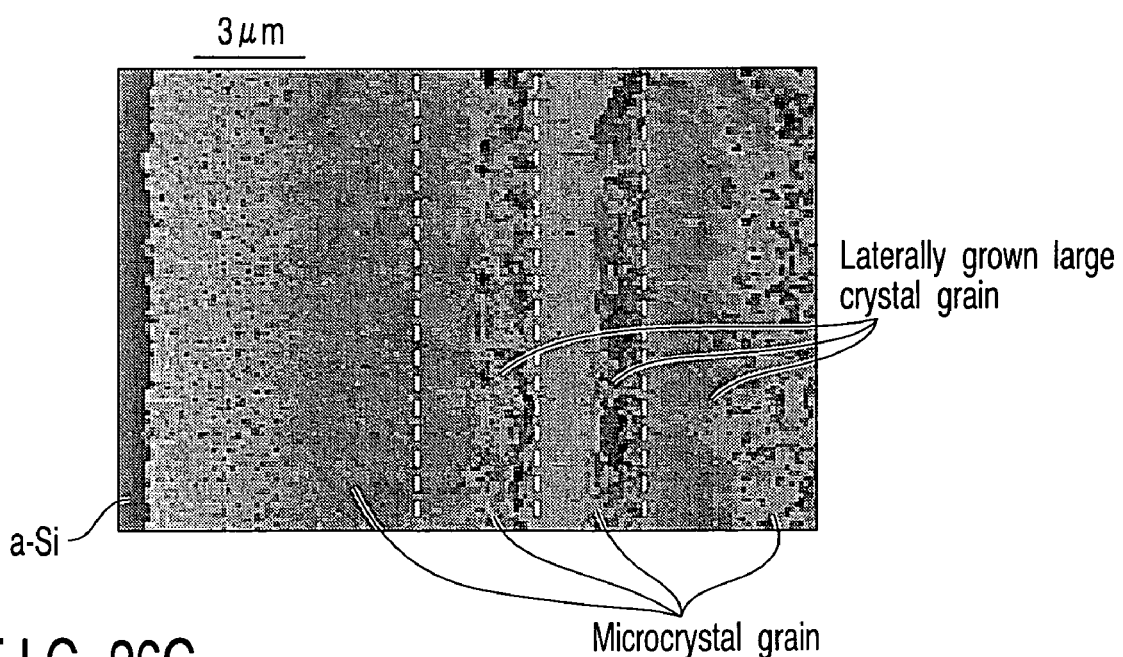
F I G. 26C

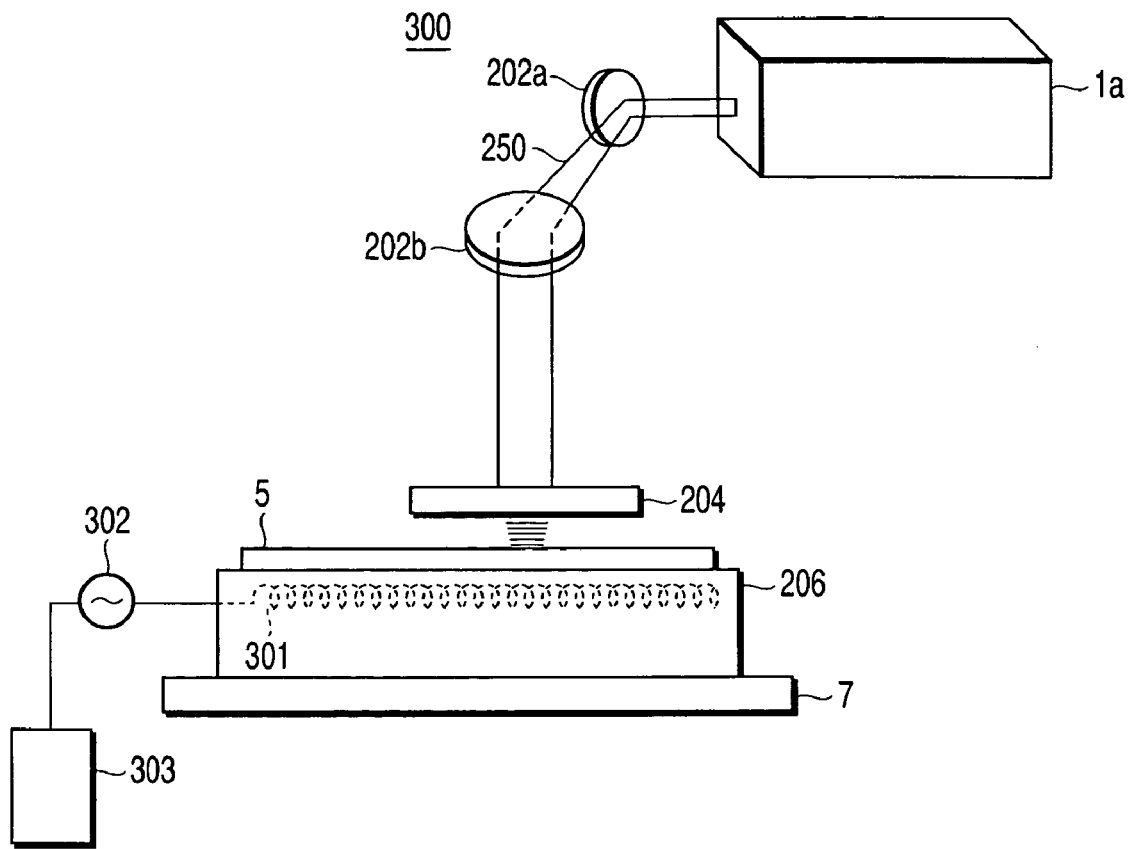
FIG. 31 (PRIOR ART)
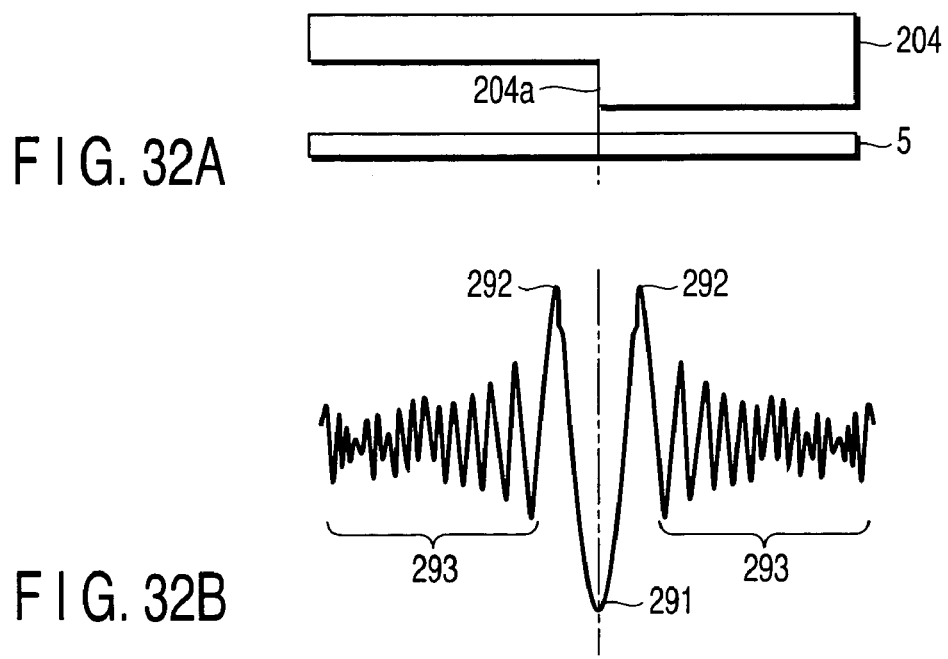
FIG. 32A
FIG. 32B

US 7,410,848 B2

CRYSTALLIZATION METHOD, CRYSTALLIZATION APPARATUS, PROCESSED SUBSTRATE, THIN FILM TRANSISTOR AND DISPLAY APPARATUS

CROSS-REFERENCE TO RELATED APPLICATIONS

This application is based upon and claims the benefit of priority from prior Japanese Patent Applications No. 2003-189093, filed Jun. 30, 2003; No. 2003-193779, filed Jul. 8, 2003; No. 2003-308935, filed Sep. 1, 2003; No. 2003-402197, filed Dec. 1, 2003; and No. 2004-093200, filed Mar. 26, 2004, the entire contents of all of which are incorporated herein by reference.

BACKGROUND OF THE INVENTION

1. Field of the Invention

The present application relates to a technique to manufacture a field effect transistor at a surface layer part of a non-single-crystal semiconductor thin film, and to single-crystal or polycrystal semiconductor thin film substrate used to manufacture a field effect transistor, and to crystallization method, a crystallization apparatus, a thin film transistor and a display apparatus suitable for manufacture of a display apparatus such as a liquid crystal or an organic EL or an electronic apparatus such as an information processing apparatus in which a field effect transistor are incorporated.

2. Description of the Related Art

A display apparatus such as a liquid crystal display unit is formed at an amorphous semiconductor film formed on a glass substrate. Specifically, as a display mode of a liquid crystal display, there is currently adopted an active matrix mode which switches individual pixels, and an amorphous silicon thin film transistor (a-SiTFT) is mainly used for a pixel switching element. Since information to be processed is digitalized and subjected to an improvement of speed due to expansion of an IT market, high performances is demanded in a display apparatus which displays such information. As means for satisfying this demand, a switching speed is increased by forming a switching transistor of respective pixels on a crystal area, thereby improving the picture quality.

In addition, miniaturization is enabled by having circuit treating data of each pixel built-in.

In the technical development of the liquid crystal display (LCD), the studies are keenly advanced with 1. realization of the high definition, 2. realization of a high numerical aperture, 3. a reduction in weight, 4. a reduction in cost and others being determined as objectives. In order to realize these performances, a technique using a polycrystal semiconductor thin film transistor (Poly-SiTFT) has come to the front. Since the Poly-SiTFT has the higher mobility than that of the a-SiTFT by two figures or more, an element size can be reduced, and a integrated circuit can be formed. Therefore, a drive circuit or an arithmetic operation circuit can be also mounted on the LCD.

A method for manufacturing a polycrystal semiconductor thin film transistor based on an excimer laser crystallization method according to the prior art will now be described with reference to FIGS. 12A to 12D. For example, as shown in FIG. 12A, an underlying protective film (e.g., an SiO₂ film, an SiN film, an SiN/SiO₂ laminated film or the like) 102 and an amorphous silicon thin film 103 are deposited on a glass substrate 101 as shown in FIG. 12A. Then, as shown in FIG. 12B, an excimer laser (XeCl, KrF or the like) 104 whose beam has been shaped into a square form or an elongated form by an optical system is used to irradiate a surface of the amorphous silicon thin film. Then, the amorphous silicon thin film 103 is converted from an amorphous structure into a polysilicon structure through a melt and solidification process in a very short time of 50 to 100 nano seconds by irradiation and heating of the excimer laser 104. When the entire surface of the amorphous silicon film 103 is scanned and heated by the excimer laser 104 in a direction indicated by an arrow 105, such a polycrystal silicon thin film 106 as shown in FIG. 12C is formed.

The above-described process is called an excimer laser annealing technique (which will be referred to as an ELA method hereinafter). The ELA method is used when manufacturing a high-quality polycrystal thin film on a substrate which is made of a material having a low melting point such as glass. In regard to these points, the detail is described in, e.g., Nikkei Microdevices, separate-volume Flat Panel Display 1999 (Nikkei Business Publications, Inc., 1998, pp. 132-139).

A thin film transistor shown in FIG. 12D is manufactured by using the polycrystal silicon thin film 106 described in FIG. 21C. A gate insulating film 107 such as an SiO₂ film is provided on the polycrystal silicon thin film 106 of this TFT by film formation. Further, a source impurity implantation area 108 and a drain impurity implantation area 109 are provided. A gate electrode 110 is provided on the gate insulating film, a protective film 111 is formed, and a source electrode 113 and a drain electrode 114 are formed. The TFT which can control a current between the source and drain by a voltage of the gate electrode is brought to completion by the above-described steps.

However, a grain size of a crystal obtained by this ELA method is approximately 0.1 µm. Therefore, in case of the thin film transistor (TFT) formed in this crystallized area, many crystal grain boundaries exist in a channel area of one thin film transistor. As a result, this transistor has the mobility of 40 to 60 cm²/Vs and an on/off current ratio of approximately $10^7$ and hence it is greatly inferior to an MOS transistor formed at single-crystal Si. Irregularities are generated in characteristics of each thin film transistor due to nonuniformity in the number of crystal grain boundaries and, in particular, there is a problem that this transistor is not suitable for a display apparatus which requires uniform display in one screen.

Furthermore, in order to improve the performances of the TFT, there has been reported a "phase modulation excimer laser crystallization method" which is a technique to single-crystallize polycrystal silicon as a method evolved from the ELA method. In the phase modulation excimer laser crystallization method, laterally grown Si crystal grain r2 whose positions are controlled can be formed by controlling a beam profile B shown in FIG. 2C. As a thesis concerning such a phase modulation excimer laser crystallization method, there is, e.g., The Ninth International Display Workshops (IDW' 2) Proceedings pp. 263-266. In the phase modulation excimer laser crystallization method, formation of a laterally grown Si crystal grain is facilitated by utilizing a controlled beam profile. In the conventional ELA method, although there is, e.g., Journal of Applied Physics Vol. 88, No. 9, 1 Nov. 2000, pp. 4994-4999 concerning a correlation of a beam profile and a crystallized cell, there is a great difference between these theses since the beam profile is not controlled in the latter.

The TFT characteristics are greatly improved without an adverse affect of the crystal grain boundaries by forming the TFT in a single crystal grain, thereby forming a function element such as processor, a memory, sensor and others. As such a crystallization method, there is, e.g., a crystallization method described in W. Yeh and M. Matsumura, Jpn. Appl. Phys. Vol. 41 (2002) 1909 or a crystallization method described in Japan Society of Applied Physics, the 63rd academic lecture in autumn 2002, preliminary manuscript correction 2, p. 779, 26a-G-2, Masato Hiramatsu and et. al.

The former reference by W. Yeh describes a cap film formed of an SiON/SiO$_2$ film or a cap film formed of an SiO$_2$ film. Phase-modulated laser beam with a fluence of 0.8 J/cm$^2$ is irradiated to an amorphous silicon film through this cap. There is described a method for crystallizing the amorphous silicon film by laterally growing a crystal grain in a direction parallel to the cap film.

Furthermore, the latter reference by Hiramatsu describes irradiation of phase-modulated laser beam which is homogenized to an amorphous silicon film through a cap film formed of an SiO$_2$ film with a substrate being heated. There is described a method by which a melted area of the amorphous silicon film can be subjected to crystal growth in the lateral direction.

However, when the silicon film is crystallized by using the conventional phase modulation excimer laser crystallization method, the following problem occurs. Laterally grown Si crystal grains r2 as well as polycrystal grains r3 on the outer thereof are generated as shown in FIG. 2D, a fine crystal grain r4 is produced at the center, and crystal grain breaking areas r5 may be further generated. That is because a light intensity distribution is not optimized.

Actually observing a structure crystallized by the phase modulation excimer laser crystallization method, single-crystallized areas r2 with a large grain size are generated, but other undesirable cells r4 and r5 are also produced.

Moreover, the method described in the reference by W. Yeh can obtain a crystal grain with a large grain size which is not less than a crystal grain size 10 μm. However, a fine crystal grain with a small grain size may be generated in the vicinity of a crystal grain grown to have a large grain size in some cases, and there is a demand to relatively evenly (i.e., densely) form crystal grains with a large grain size all together as an entire film structure.

Additionally, in the methods described in the reference by W. Yeh and the reference by Hiramatsu, there is a demand for low-temperature or ordinary-temperature processing with respect to a temperature of a substrate in order to increase a grain size of crystal grains. For example, in a conventional crystallization apparatus 300 shown in FIG. 31, laser beam 250 is irradiated while heating a substrate 5 in a high-temperature area by using a heater 301 included in a mount base 206. The heater 301 receives a power from a power supply 302 which is controlled by a controller 303, and has a capability to heat the substrate 5 to a temperature area of 300 to 750° C.

The substrate heating temperature may exceeds, e.g., 500° C. in some cases. Then, general-purpose glass (e.g., soda glass) or plastic is apt to be transformed or deformed due to heating, and the low-temperature processing is a prerequisite in order to adopt such general-purpose glass for a substrate in a liquid crystal display (LCD). Further, in a large-screen LCD, there is a tendency to reduce a plate thickness of a substrate since there is a strong demand to reduce a weight thereof, and deformation is apt to occur due to heating. Therefore, the low-temperature processing is a prerequisite in order to assure the flatness of a thin substrate.

It is an object of the present invention to provide a crystallization method and apparatus, a thin film transistor and display apparatus which can design pulse laser beam ("laser beam" described below means pulse laser beam) having a light intensity and a distribution optimized on an incident surface of a substrate, form a desired crystallized structure while suppressing occurrence of other undesirable structure areas and satisfy a demand for low-temperature processing.

BRIEF SUMMARY OF THE INVENTION

To achieve this aim, the present invention has the following structure. A laser beam intensity JL with which lateral growth starts, a laser light intensity JB which can be inputted are checked in advance. A beam profile is measured on the same surface as a substrate surface. A beam profile is set to have a waveform which has a monotonous increase and a monotonous decrease such that a minimum laser intensity becomes not less than JL and a maximum laser beam intensity becomes less than JB, e.g., a triangular waveform. At this time, since a position at which JL is obtained becomes a crystallization start position, a crystal position can be defined.

A crystallization method according to the present invention irradiates to a non-single-crystal semiconductor thin film laser beam having a light intensity distribution which cyclically repeats a monotonous increase and a monotonous decrease at predetermined intervals in an irradiation area of the non-single-crystal semiconductor film. When irradiating the laser beam, as to the light intensity distribution, it is assumed that the light intensity which is equal to or above a light intensity which melts the non-single-crystal semiconductor film and allows it to grow in the lateral direction is a minimum value. Furthermore, it is presumed that the light intensity which is lower than the light intensity which causes breaking in the laterally grown crystal grain is a maximum value. These are the characteristics of the invention. By irradiating the laser beam having such a light intensity distribution, the crystal grain stably grows in the lateral direction without being broken. Then, it becomes a large crystal grain structure with an even size suitable for a thin film transistor (area 3 in FIG. 3).

Moreover, the minimum value of the light intensity distribution is characterized in that the non-single-crystal semiconductor thin film is melted. By irradiating laser beam having such a light intensity distribution, the structure of the non-single crystal semiconductor thin film is all crystallized and becomes a polycrystal structure (area 2 in FIG. 3).

Additionally, the maximum value of the light intensity distribution is characterized in that the minimum value of the light intensity distribution is lower than the light intensity which melts the non-single-crystal semiconductor film, and in a light intensity range lower than the light intensity which causes breaking in the laterally grown crystal grain. By irradiating laser beam having such a light intensity distribution, a ratio of the polycrystal structure and the amorphous structure can be arbitrarily changed (areas 1 and 2 in FIG. 3).

The maximum value and the minimum value of the light intensity are set in accordance with conditions of at least a film thickness and a temperature of a non-single-crystal semiconductor thin film. For example, under the condition of a substrate temperature of 500° C., it is possible to set a beam profile BP shown in FIG. 9B. It is to be noted that the beam profile BP shown in FIG. 9B has a light intensity on a vertical axis being a standardized dimensionless index. This standardized light intensity index can be converted into a laser fluence having an actual unit (J/cm$^2$). For example, the light intensity index can be converted into a laser fluence (J/cm$^2$) at each position by multiplying the light intensity index by an average laser fluence (J/cm$^2$).

According to the present invention, there is provided a crystallization apparatus which crystallizes a non-single-crystal semiconductor thin film by irradiating laser beam thereto, comprising: a laser beam source; a mount base on which a substrate having the non-single-crystal semiconductor thin film mounted thereon; a spatial intensity modulation optical element which is inserted between the laser beam source and the substrate and modulates a light intensity distribution on an incident surface of the substrate; means for measuring an intensity and a distribution of laser beam on the incident surface of the substrate by using the laser beam (beam profile measuring device); means for designing a light intensity distribution that a monotonous increase and a monotonous decrease are cyclically repeated at predetermined intervals in an irradiation area, a minimum value of the light intensity distribution is a value exceeding a light intensity with which the non-single-crystal semiconductor thin film is melted and a light intensity lower than a light intensity with which the laterally grown crystal grain is broken is a maximum value when designing the preset intensity and the distribution of the laser beam as targets; and means for leading the laser beam modulated by the spatial intensity modulation optical element to the incident surface of the substrate in such a manner that the measured light intensity and distribution match with the set targets.

It is desirable that the measuring means has a fluorescent screen on the incident surface to which a reference light beam enters and measurement is carried out with the fluorescent screen being arranged on substantially the same level as the incident surface of the substrate.

It is desirable that the spatial intensity modulation optical element uses a homogenization optical system including a phase shifter as will be described later. The homogenization optical system is constituted of a homogenizer including a pair of small lenses and optical components such as a plurality of sets of condenser lenses.

Here, the "laser fluence" means a scale of the light intensity representing the laser energy density, which is obtained by integrating an energy quantity per unit area into that per unit time.

Furthermore, the "beam profile" means a light intensity distribution of laser beam which enters a crystallization target film. It is to be noted that the reference light beam which enters a profiler (beam profile measurement portion) are the same as a light source used for laser annealing. However, it does not have to have the same laser fluence required for crystallization, it may have a light intensity required for measurement of beam profile.

Moreover, the "preset light intensity and distribution as targets" means the following based on a later-described empirical test. They are an intensity (laser fluence) and a distribution (beam profile) of the laser beam with which it is confirmed that the non-single-crystal semiconductor thin film is melted and subjected to lateral crystal growth and that the crystallized film is not broken.

FIG. 3 is a state diagram showing a qualitative relationship between a temperature, a light intensity and a structure of a semiconductor (e.g., silicon) by forming dimensionless vertical and horizontal axes. In the drawing, a characteristic line JC indicates a boundary (boundary of crystallization) on which a non-single-crystal semiconductor is crystallized (re-crystallized) or not. A characteristic line JL indicates a boundary (boundary of lateral growth) on which a crystal grain grows in the lateral direction or not. A characteristic line JB indicates a boundary on which the grown crystal grain is finally broken or not.

In an area 1 below the characteristic JC, a physical state of the non-single-crystal semiconductor does not vary.

In an area 2 between the characteristic lines JC and JL, the non-single-crystal semiconductor is crystallized (re-crystallized) but does not grow in the lateral direction.

In an area 3 between the characteristic liens JL and JB, the crystal grain stably grows in the lateral direction without being broken.

In an area 4 above the characteristic line JB, the film (crystal structure) is broken under various kinds of stresses in or after the growth of the crystal grain.

Here, the "film breaking" means that a regular structure (film structure) constituting the film is broken in the broad sense. It means that the laminated structure or the cap film is broken by a stress generated when the crystal grain grows in the lateral direction or that the crystallization target film is broken by a stress generated during the lateral growth in the narrow sense. Alternatively, it means that a defect such as a crack is generated in the crystal grain or the crystal grain boundary due to hydrogen contained in the cap film or the crystallization target film.

In regard to the means for solving the above-described problem, there has been described that the attention is paid to the beam profile and the light intensity, the monotonous decrease and the monotonous increase are observed, the light intensity range must be not less than JL which is required for the lateral growth and the crystal grain must fall within a range which is not more than JB. Further, the present inventors and others have keenly studied on densely forming crystal grains each of which is as large as at least one thin film transistor can be formed. Furthermore, they have found that irradiation of parallel laser beam (unhomogenized light beam) in the prior art cannot precisely increase a grain size of a crystal grain. Although a cause of this matter is not revealed in the strict sense, it is estimated that the following is the cause.

FIG. 32 is a characteristic curve diagram showing a substrate 5 having an optical system formed of a phase shifter 204 and a non-single-crystal semiconductor layer, and a light intensity distribution after parallel laser beam is transmitted through the phase shifter 204. In this light intensity distribution, a component from a first inverse peak wave 291 to a next peak wave 292 contributes to lateral growth. On the other hand, in regard to a higher-order oscillatory wave 293 outside this waveform, a crystal nucleus is generated due to the inverse peak wave and a fine crystal grain is produced. Therefore, an entire film cannot be evenly and densely crystallized with a large grain size. That is, with the parallel laser beam, since the light beam obtained by modulating a phase of the laser beam includes the higher-order oscillatory wave 293, it was found that crystal grains with a large grain size cannot be densely formed.

According to the crystallization method of the present invention, crystal grains with a relatively large grain size can be densely aligned and formed by causing the homogenized laser beam to enter a non-single-crystal semiconductor film through a phase modulation optical system and a silicon oxide film as an insulating film. The laser beam which does not include the higher-order oscillatory wave 293, has such a light intensity distribution BP as shown in FIG. 13B and has been transmitted through the phase modulation optical system is irradiated to the non-single crystal semiconductor film. The crystal grains with a large grain size can be densely (evenly) aligned and formed. The light intensity distribution BP shown in FIG. 13B is a light intensity distribution having V-shaped grooves as shown in FIG. 13C when three-dimensionally illustrated in a perspective view. This light intensity distribution BP has a plurality of peak patterns with inverted-triangular cross sections. Here, the present inventors and others refer to this shape as a peak pattern with an inverted-triangular cross section. When a step portion 204a is set at the center and seen as one shape in FIG. 13B with a pitch width PW in FIG. 13A, its cross section has an inverted-triangular shape, and hence it is referred to as the peak pattern with the inverted-triangular cross section. The shape shown in FIG. 9B is referred to as a triangular shape because gaps W1 and W2 of a step portion 31a are regarded as one shape and its light intensity distribution BP provided by cross section has a triangular shape. It is just a difference in position of an eye view when grasping one shape, and there is no substantial difference.

In the light intensity distribution having each peak pattern with an inverted-triangular cross section in FIG. 13C, amplitudes PH are equal and pitch intervals PW are also equal. The phase modulation optical system uses, e.g., a phase shifter.

Moreover, a solidification start temperature of a melted part of the non-single-crystal semiconductor film irradiated with the laser beam has physical properties inherent to the semiconductor film as a target. Thus, the present inventors and others have considered that a start fluence of lateral growth is a numeric value inherent to the semiconductor film and found that it is a substantially fixed value irrespective of the fluence of the pulse laser. In regard to termination of lateral growth, there are the following two cases. The lateral growth is terminated when a cooling speed is higher than a growth speed and a new nucleus is generated in a growth direction, and when there is a physical factor such that the cap film or the semiconductor film is peeled off due to instantaneous heating. In particular, as to occurrence of peeling, it has been found that existence of a flat part in the inverse peak pattern largely contributes to peeling since peeling of the semiconductor film occurs when an energy which is not less than a given value is irradiated into the semiconductor film.

Additionally, a substrate temperature dependency of a lateral growth distance has been evaluated by utilizing generation of light beam having peak patterns with optimum inverted-triangular cross sections obtained by the phase modulation optical system and a thermal storage effect of an appropriate cap film. As a result, as shown in FIG. 20, it has been discovered that Si crystal grains with a large grain size can be obtained even at a room temperature. As to the light beam having the peak patterns with the optimum inverted-triangular cross sections, a maximum value and a minimum value of the peak pattern with the inverted-triangular cross section are optimized, and a distance between the maximum values is sufficiently increased.

The present invention is based on the above-described knowledge, and has the following structure.

The crystallization method according to the present invention is a crystallization method which crystallizes a non-single-crystal semiconductor film by irradiating laser beam to it. Further, it is characterized in that at least a silicon oxide film is provided on a laser beam incident surface of the non-single-crystal semiconductor film and the laser beam is laser beam which has a light intensity distribution having a plurality of peak patterns with inverted-triangular cross sections.

The crystallization apparatus according to the present invention is a crystallization apparatus which crystallizes a non-single-crystal semiconductor film by irradiating laser beam thereto. The crystallization apparatus comprises: a laser beam source; a mount base on which a substrate having a non-single-crystal-semiconductor film is mounted; a homogenizer which is provided between the mount base and the laser beam source and homogenizes the laser beam in regard to a light intensity; and a phase modulation optical system which is provided between the homogenizer and the mount base and has a plurality of parts which modulate a phase of laser beam homogenized by the homogenizer.

A processed substrate according to the present invention comprises: a substrate formed of at least one material of an insulator, a semiconductor and a metal; a first insulating layer provided on the substrate; an amorphous semiconductor film or a non-single-crystal semiconductor film provided on the first insulating layer; and a second insulating layer which is provided on the amorphous semiconductor film or the non-single-crystal semiconductor film and has a thickness which is not less than 150 nm and not more than 350 nm. As the first insulating layer and the second insulating layers, silicon oxide films are optimum.

A thin film transistor according to the present invention is a pixel of a display apparatus and a thin film transistor which drives this pixel. The thin film transistor comprises: an insulative substrate; a channel area formed in a crystal grain with a large grain size formed by forming a silicon oxide film as a cap film on a non-single-crystal semiconductor film formed on the substrate, causing laser beam which has a light intensity distribution with a plurality of peak patterns with inverted-triangular cross sections to enter from the silicon oxide film, allowing the laser beam to reach the non-single-crystal semiconductor film through the silicon oxide film, melting the non-single-crystal semiconductor film, storing heat in the silicon oxide film provided on a laser beam incident surface of the non-single-crystal semiconductor film, delaying a solidification speed of the non-single-crystal-semiconductor film and crystallizing the non-single-crystal semiconductor film in a lateral direction; a source area and a drain area which are provided to sandwich the channel area and have predetermined impurities doped therein; a gate insulating film formed on the channel area; a gate electrode formed on the gate insulating film; an interlayer insulating film covering the gate electrode; a source electrode which electrically communicates with the source area from the interlayer insulating film side; and a drain electrode which electrically communicates with the drain area from the interlayer insulating film side.

A display apparatus according to the present invention is a display apparatus which has a pair of substrate bonded with each other through a predetermined gap therebetween and an electro-optic material held in the gap, forms an opposed electrode on one substrate and forms a pixel and a thin film transistor which drives the pixel on the other substrate, the thin film transistor comprising: an insulative substrate; a channel area formed in a crystal grain with a large grain size formed by forming a silicon oxide film as a cap film on a non-single-crystal semiconductor film formed on the substrate, causing laser beam which has a light intensity distribution with a plurality of peak patterns with inverted-triangular cross sections to enter from the silicon oxide film, allowing the laser beam to reach the non-single-crystal semiconductor film through the silicon oxide film, melting the non-single-crystal semiconductor film, storing heat in the silicon oxide film provided on a laser beam incident surface of the non-single-crystal semiconductor film, delaying a solidification speed of the non-single-crystal-semiconductor film and crystallizing the non-single-crystal semiconductor film in a lateral direction; a source area and a drain area which are provided to sandwich the channel area and have predetermined impurities doped therein; a gate insulating film formed on the channel area; a gate electrode formed on the gate insulating film; an interlayer insulating film covering the gate electrode; a source electrode which electrically communicates with the source area from the interlayer insulating film side; and a drain electrode which electrically communicates with the drain area from the interlayer insulating film side.

In this specification, the "phase sifter" is an example of a phase modulation optical system and means a spatial intensity modulation optical element which is used to modulate a phase of laser beam. It is discriminated from a phase shift mask which is used in an exposure step in a photolithography process. By introducing a progressive design concept to the phase shifter, a one-dimensional light intensity distribution BP which is schematically shown in FIG. 14B can be obtained. That is, it is possible to obtain a light intensity distribution BP which has different intensity tilt angles θ, pitch widths PW and bias intensities PH (intensity in a root area). The phase shifter has a step formed to a quartz base substance as, e.g., a transparent material. The step of the phase shifter is formed into a size with which a phase of incoming light beam can be modulated to have a predetermined phase angle, e.g., 180° by a process of etching or the like.

In the present invention, pulse laser beam whose light intensity distribution is optimized are irradiated. That is, pulse laser beam shown in FIGS. 13B, 26A and 29C from which the affect of the higher-order oscillatory wave 293 is eliminated is irradiated to a semiconductor film (an amorphous film or a polycrystal film) to be crystallized through a silicon oxide film. As shown in FIG. 17, the non-single-crystal semiconductor film as a crystallization target, e.g., the amorphous silicon film 252 is heated by irradiation of the pulse laser beam 250, and its temperature ($T_{Si}$) is high at the end of the pulses. During the pulse irradiation, heat generated in the amorphous silicon film 252 as the crystallization target is transferred to, e.g., a low-temperature silicon oxide film ($SiO_2$ film) provided as the cap film 253 on the earlier stage. After end of the pulse irradiation (after irradiation of the laser beam is interrupted), the amorphous silicon film 252 as a crystallization target starts to be cooled down, and heat stored in the cap film 253 is diffused toward the amorphous silicon film 252 as the crystallization target. In this manner, the cap film 253 dominantly serves as a heat capacitor, and a high-temperature liquid phase state of the amorphous silicon film 252 can remain longer than that when the cap film 253 is not used.

However, the cap film 253 partially returns heat transferred from the melted amorphous silicon film 252, but holds a large quantity of heat therein. Therefore, the melted amorphous silicon film 252 is supplied with heat from the cap film 253, and a solidification start time of the melted amorphous silicon film 252 can be delayed. As a result, a lateral growth distance of the crystal grains is increased, and the crystal grains with a large grain size are densely aligned and formed. The above-described supplied of heat from the cap film 253 greatly varies depending on a film thickness of the cap film 253. That is, according to the method of the present invention, a cooling speed of the semiconductor film is moderated by the silicon oxide film which is the cap film 253 with heat storage properties which is in contact with the amorphous silicon film as the semiconductor film. The single-crystal grains or crystal grains close to them with a large grain size can be obtained at a room temperature without heating the substrate.

It is desirable to set the film thickness of the cap film 253 to be not less than 30 nm and not more than 500 nm in terms of the heat storage characteristics, and it is most preferable to set it to be not less than 100 nm and not more than 370 nm (see FIGS. 23 and 33). When the film thickness is lower than 30 nm, a heat storage quantity of the $SiO_2$ cap film becomes insufficient, and the large crystal grains with a desired size cannot be obtained. On the other hand, when the film thickness is larger than 500 nm, a heat transfer quantity (heat release; a thermal diffusion quantity) in a thickness direction from the crystallization target film (non-single-crystal semiconductor film) toward the $SiO_2$ cap film 253 is increased, and hence the object of the heat storage cannot be successfully achieved.

Further, the laser beam is homogenized in relation to an incident angle by a first fly-eye lens as a homogenization optical system (homogenizer) and a first condenser optical system. Furthermore, they are homogenized in relation to a light intensity by a second fly-eye lens and a second condenser optical system. When the laser beam homogenized in relation to the incident angle and the light intensity are transmitted through the phase shifter 204 shown in FIG. 13A, the light intensity has a shape in which a monotonous increase and a monotonous decrease are repeated as shown in FIG. 13B. This becomes the above-described ideal light intensity distribution BP. The light intensity distribution BP shown in FIG. 13B has a shape with an inverted-triangular cross section, and a maximum peak value and a minimum peak value are projecting, and there is no flat portion. Moreover, this light intensity distribution has equal amplitudes PH and equal pitch intervals PW. That is, since the homogenized laser beam subjected to phase modulation does not include a higher-order oscillatory component, the large crystal grains with a size according to a width gap W between the steps 4a and 4a of the phase shifter can be theoretically grown in the lateral direction when such laser beam is irradiated to the film to be crystallized. At this time, since the heat energy is supplied to the film to be crystallized by the thermal storage effect of the insulating layer, a series of processes from melting, solidification and crystallization and crystal grain lateral growth can be facilitated, and a size of the crystal grains is increased. Since film breaking of the non-single-crystal semiconductor film is apt to occur when an angle θ of the peak portion becomes moderate in the light intensity distribution BP in FIG. 13B, it is desirable to set the light intensity distribution BP in such a manner that the angle θ of the peak portion becomes an angle which is as sharp as possible.

As described above, according to the present invention, the laser beam having a light intensity and a distribution optimized on the incident surface of the substrate can be designed, and a desired crystallized structure can be formed while suppressing occurrence of any other undesirable structure area such as film breaking. That is, the crystal grains stably grow in the lateral direction without being broken, and become a large crystal grain structure with even sizes which is suitable for a thin film transistor (area 3 in FIG. 3).

Additionally, according to the present invention, in light intensity distribution, it is determined that a light intensity which is equal to or above a light intensity with which a structure of the non-single-crystal semiconductor film is crystallized is a minimum value. Further, it is determined that a light intensity lower than a light intensity with which the crystallized crystal grains grow in the lateral direction is a maximum value. As a result, the structure of the non-single-crystal semiconductor film can be all crystallized to be a polycrystal structure (area 2 in FIG. 3).

Furthermore, according to the present invention, in the light intensity distribution, it is determined that a light intensity equal to or larger than a light intensity with which the structure of the non-single-crystal semiconductor film is crystallized is a maximum value in a light intensity range lower than a light intensity which produces breaking in the laterally grown crystal grains. Moreover, it is determined that a light intensity lower than a light intensity with which the structure of the non-single-crystal semiconductor thin film is crystallized is a minimum value. As a result, a ratio of the polycrystal structure an the non-polycrystal structure, e.g., amorphous structure, can be freely changed (areas 1 and 2 in FIG. 3).

Additionally, according to the present invention, Si crystal grains with a large grain size can be formed by room-temperature processing, and the demand for low-temperature processing can be satisfied. Therefore, it is possible to adopt a glass substrate or a plastic substrate which is thinner than that in the prior art as the substrate.

Further, according to the present invention, since the precise crystal grains with a large grain size can be aligned and formed on the entire film, it is possible to manufacture a TFT for a large-screen LCD with a higher operating speed and less irregularities in threshold voltage.

BRIEF DESCRIPTION OF THE SEVERAL VIEWS OF THE DRAWING

FIG. 2A is a view showing a beam profile A;

FIG. 2B is a plan view schematically showing a crystallized structure formed by laser beam irradiation having the beam profile A;

FIG. 2C is a view showing a beam profile B;

FIG. 2D is a plan view schematically showing a crystallized structure formed by laser beam irradiation having the beam profile B;

FIG. 14A is a view schematically showing a light intensity distribution on a substrate of laser beam whose phase is modulated;

FIG. 14B shows a scanning type electronic microscope (SEM) image representing a sample crystallized by single-shot irradiation of pulse laser beam;

FIG. 16 is an internal perspective block diagram showing an optical system of the apparatus according to the present invention;

FIG. 18 shows an SEM image representing an effect of the present invention;

FIG. 19 is a characteristic view showing the effect of the present invention;

FIG. 20 is a characteristic view showing the effect of the present invention;

FIG. 21 is a characteristics view showing the effect of the present invention;

FIG. 22 is a structural block diagram illustrating another embodiment of FIG. 15;

FIG. 23 is a characteristic view showing the effect of the present invention;

FIG. 26A is a light intensity distribution diagram;

FIG. 26B shows an SEM image of a sample after Secco-etching;

FIG. 26C shows an SEM image of a sample after Secco-etching;

FIG. 31 is a structural block diagram showing an outline of a conventional apparatus;

FIG. 32A is a view showing a phase shifter and a substrate;

FIG. 32B is a view showing a light intensity distribution after parallel pulse laser beam is transmitted through the phase shifter;

DETAILED DESCRIPTION OF THE INVENTION

Embodiments according to the present invention will now be described hereinafter with reference to the accompanying drawings.

Figure 1:
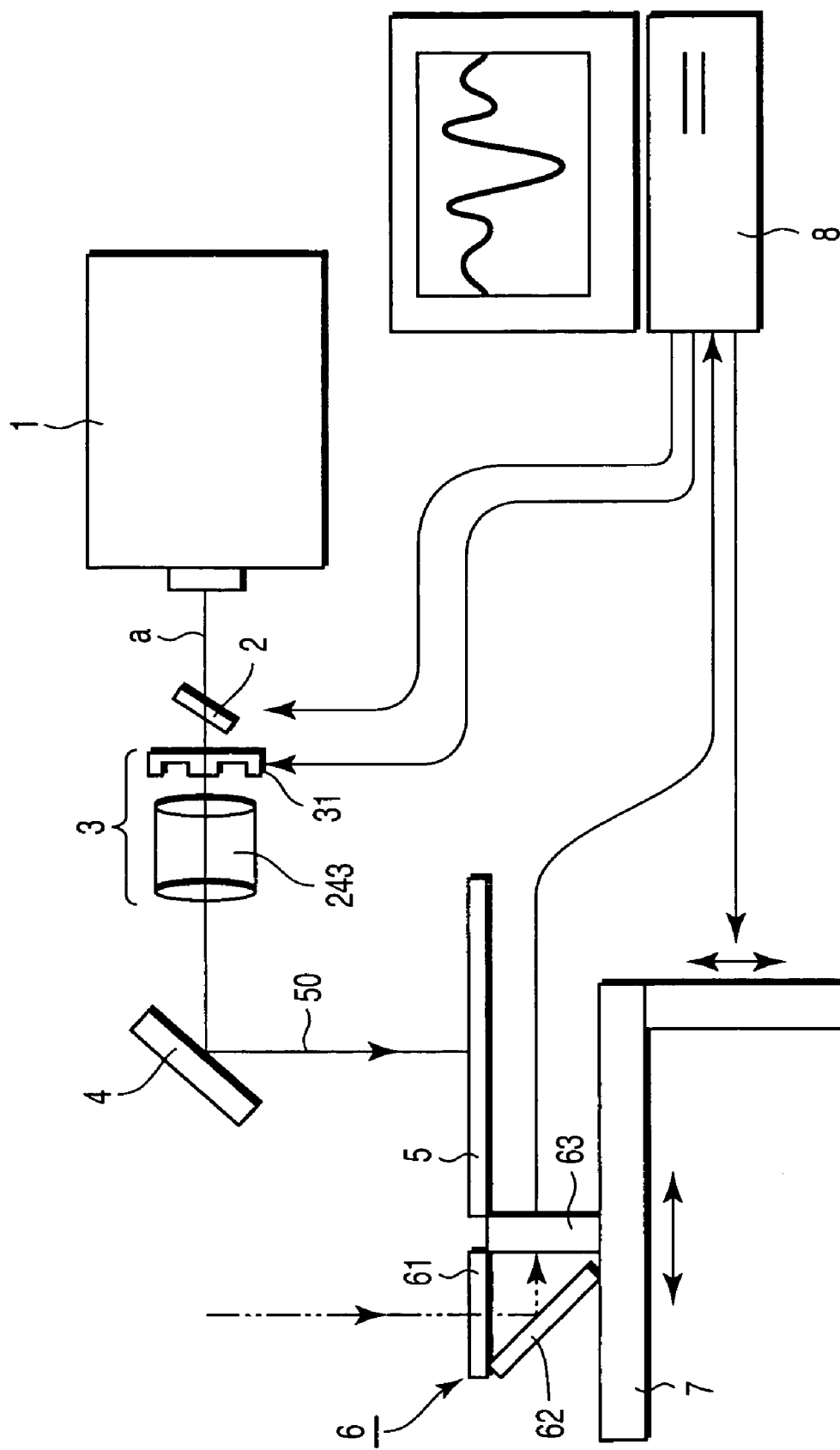
FIG. 1 is a structural block diagram showing a embodiment of crystallization apparatus according to the present invention.
Figure 3:
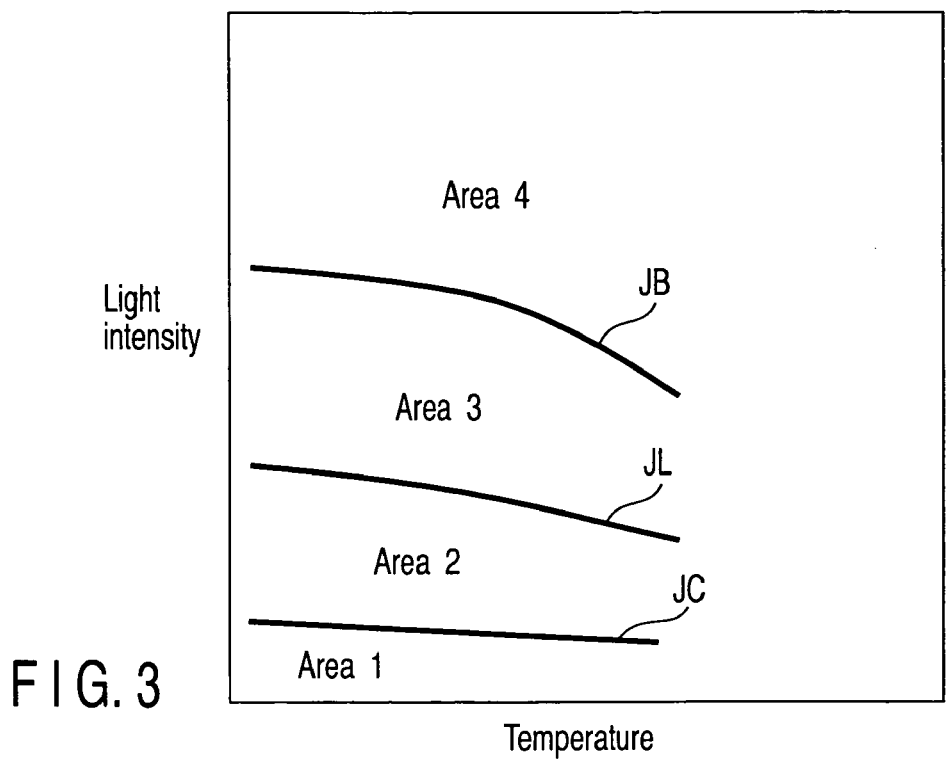
FIG. 3 is a state diagram showing a qualitative relationship between a temperature, a light intensity and a structure.

FIG. 1 is a schematic view showing a laser crystallization apparatus embodying the present invention. In a laser crystallization apparatus, an attenuator 2 and a beam profile modulation portion 3 are arranged at a starting end of an optical axis a of a laser beam source 1 containing the homogenization optical system, and a semiconductor substrate 5 is provided at a trailing end through a mirror 4. Further, a beam profile measurement portion 6 is provided to be aligned with the semiconductor substrate 5, and the semiconductor substrate 5 and the beam profile measurement portion 6 are fixed to a moving stage 7.

Furthermore, a control personal computer 8 as a controller is set, the beam profile measurement portion 6 is connected on an input side of the personal computer 8, and control systems of the attenuator 2, the beam profile modulation portion 3 and the moving stage 7 are respectively connected to an output side of the same.

The attenuator 2 optically modulates an intensity (power) of laser beam by adjusting an angle of a multilayer film coating filter of an inductor, and includes a sensor, a motor and a control system which are not illustrated.

The beam profile modulation portion 3 modulates a spatial intensity distribution of laser beam, and is constituted of a phase shifter 31 and a image formation optical system 243. The phase shifter 31 generates an inverse peak pattern in which a light intensity becomes minimum at a phase shift portion by alternately shifting a phase of light beam passing through a mask pattern by 0 and π, for example. This inverse peak pattern is used to control a position of an area (crystal nucleus) which is first solidified on the semiconductor substrate 5 and allow a crystal to grow in a lateral direction from this position toward the periphery (lateral growth). Thus, a crystal grain with a large grain size is provided at a specified position. At this time, a desired beam profile is set based on a shape of the phase shifter, a distance from the semiconductor substrate 5, an angular distribution of laser beam and others. The phase shifter 31 includes a sensor, an actuator and a control system which are not illustrated and used for replacement of a mask pattern or positioning in an optical axis direction.

The homogenization optical system is disclosed in detail in the specification or the like of Jpn. Pat. Appln No. 2003-110861 precedently filed by the present inventors and others, and constituted of a homogenizer including a pair of small lenses and optical components such as a plurality of sets of condenser lenses. The semiconductor substrate 5 is held at a focal position of this homogenization optical system, and laser beam 50 is irradiated. A shape and a width of an inverse peak pattern are controlled based on a pattern of a phase modulation phase shifter 31 and a defocusing quantity at this moment. In case of a proximity type crystallization apparatus (FIG. 15), a width of the inverse peak pattern is enlarged in proportion to a ½ power of a gap d between the phase shifter 31 and the semiconductor substrate 5.

The beam profile measurement portion 6 receives ultraviolet excimer laser beam on a fluorescent screen 61 to be converted into visible light beam, and receives on a CCD 63 the visible light beam reflected on a mirror 62 in order to simultaneously measures an intensity and a beam profile of the laser beam. The intensity of the laser beam may be separately measured by using a semiconductor power meter or the like. Moreover, the ultraviolet excimer laser beam may be directly received on the CCD 63.

The fluorescent screen 61 is set on a plane which is the same level with or on a plane parallel with the semiconductor substrate 5. When the fluorescent screen 61 is set on the parallel plane with a step, the fluorescent screen 61 is positioned at the same height as that of the semiconductor substrate 5 by moving up and down the moving stage 7 and measurement is carried out. As a result, a beam profile of the laser beam on the substrate surface can be measured under the same condition as that in case of actual beam irradiation.

An image received on the CCD 63 is inputted to the personal computer 8 and sliced on an arbitrary scanning line, and an intensity and a beam profile of the laser beam are measured based on an intensity distribution of an image signal.

Then, the measured intensity is compared with a preset target intensity, an operation quantity is calculated, and an angle of the attenuator 2 is adjusted while feeding back in such a manner the measured intensity becomes the target intensity by outputting an operation signal to the attenuator 2.

Additionally, the measured beam profile is compared with a preset target beam profile, and an operation quantity is calculated. Operation signals are outputted to the beam profile modulation portion 3 and the moving stage 7, a position of the phase shifter 31 and a height of the moving stage 7 are adjusted while feeding back in such a manner that the measured beam profile becomes the target beam profile.

The moving stage 7 can be moved in the three-dimensional direction, i.e., a front-and-back direction, a right-and-left direction and an up-and-down direction, and includes a sensor, an actuator and a control system which are used for positioning in an in-plane direction or an optical axis direction and not illustrated. The beam profile measurement portion 6 is moved and positioned at a laser beam irradiation position by this moving stage 7, and designed in such a manner that an intensity and a beam profile of the laser beam can be measured in advance before irradiating the laser beam onto the substrate.

The laser crystallization apparatus embodying the present invention has the above-described structure. In a laser crystallization step, the moving stage 7 is first moved in the in-plane direction in order to position an end of the optical axis a of the laser beam source 1 containing the homogenization optical system on the fluorescent screen 61 of the beam profile measurement portion 6, and the laser beam is irradiated to measure an intensity and a beam profile thereof.

Then, an angle of the attenuator 2, a position of the phase shifter 31 and a height of the moving stage 7 are respectively positioned in such a manner that the measured intensity and beam profile match with the preset targets. Subsequently, the moving stage 7 is moved in the in-plane direction, the end of the optical axis a is then positioned in a predetermined crystal area of the semiconductor substrate 5, a gap d is also set in case of the proximity type crystallization apparatus (FIG. 15), and the laser beam having the preset intensity and beam profile are irradiated.

The above-described measurement, positioning and beam irradiation are repeated, crystal areas which have various sizes are separately formed in the same substrate at the same time. In place of alternately performing measurement, positioning and beam irradiation in this manner, it is possible to first perform all measurements, calculate an operation quantity required for position, and then carry out positioning and beam irradiation at the same time in accordance with each crystal area.

Figure 4A:
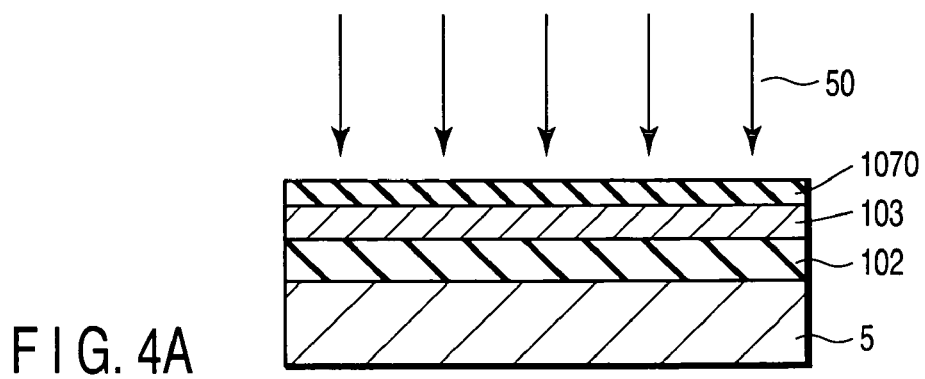
FIGS. 4A and 4B are cross-sectional type drawings illustrating steps when manufacturing a semiconductor element according to the present invention.

First, as a preparation of the substrate, as shown in FIG. 4A, an insulator substrate is selected (e.g., Corning 1737 glass, melted quartz, sapphire, plastic, polyimide and others). On a surface thereof is formed a first thin film 102 (e.g., an $SiO_2$ film with a film thickness of 300 nm formed by a plasma vapor deposition method using tetraethylorthosilicate (TEOS) and $O_2$, or $SiN/SiO_2$ laminated film alumina, mica and others). An amorphous semiconductor thin film 103 (e.g., amorphous Si, amorphous SiGe or the like with a film thickness of 200 nm obtained by the plasma chemical vapor deposition method) as a second thin film is formed on a surface of the first thin film 102. On a surface of the second thin film is further formed an $SiO_2$ film 1070 with a film thickness of, e.g., 200 nm as a cap film by the plasma chemical vapor deposition method using tetraethylorthosilicate (TEOS) and $O_2$. Then, dehydrogenation processing of the thin film is performed (e.g., heating processing in a nitrogen atmosphere at 600° C. for one hour). The following points are checked with respect to this crystallization substrate, and adjustment is performed to obtain a preferable beam profile.

(i) A laser beam intensity JL with which lateral growth occurs is checked with the crystallization substrate used.

(ii) A laser beam intensity JB with which breaking of crystal grains occurs is checked with the crystallization substrate used.

(iii) In regard to a distribution of the laser beam intensity, a laser beam intensity J at a position which should be a crystallization start point is determined as JB>J≧JL in order to obtain a laser intensity distribution which is monotonously increased toward a maximum laser beam intensity.

The maximum laser beam intensity is set to be less than JB. Performing crystallization satisfying this enables crystallization by which a crystal grain breaking area and a fine crystal area are not generated.

Figure 6:
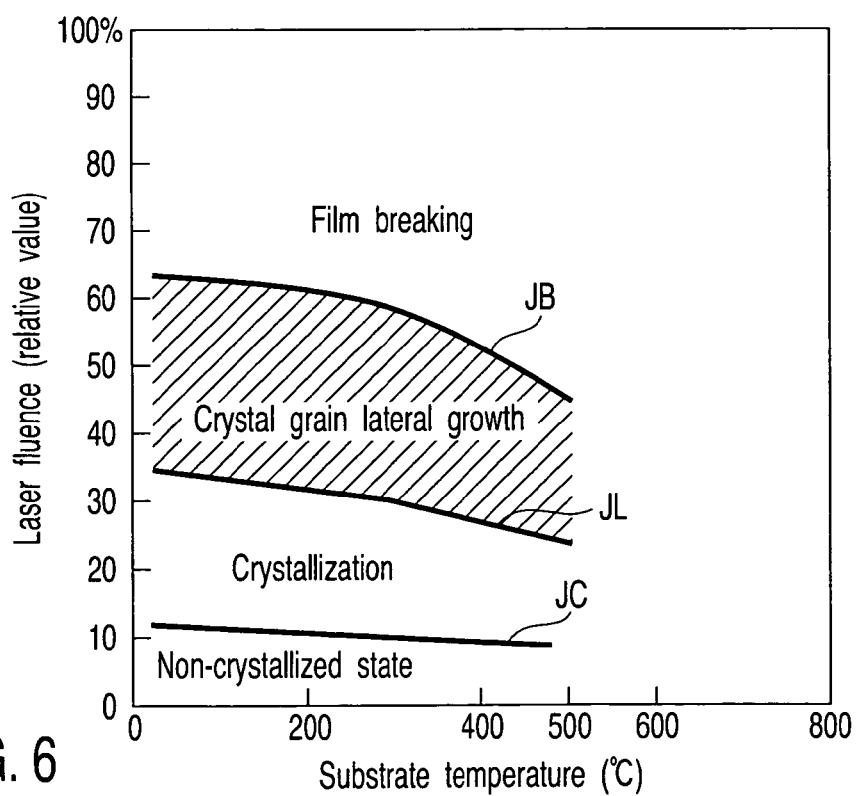
FIG. 6 is a state diagram showing a quantitative relationship between a substrate temperature, a laser fluence and a structure.

When a concrete experiment was conducted by using the above-described substrate, such a result as shown in FIG. 6 was obtained. FIG. 6 is a state diagram showing a result of checking a quantitative relationship between a temperature, a light intensity and a structure in a silicon thin film with a horizontal axis representing a substrate temperature (° C.) and a vertical axis representing a laser fluence (relative value). As apparent from this drawing, at, e.g., 500° C., a lateral growth start intensity JL was 20 to 30% (corresponding to a converted intensity of, e.g., 0.4 to 0.6 $J/cm^2$) as a relative value, and a film breaking generation intensity JB was 20 to 60% (corresponding to a converted intensity of, e.g., 0.4 to 1.2 $J/cm^2$) as a relative value. Therefore, it was revealed that setting the laser beam intensity in a net area under the above-described condition (iii) (JB and JL are laser beam intensities in the net) and irradiating the laser beam at each substrate temperature can suffice.

Then, laser crystallization is carried out by using the laser crystallization apparatus shown in FIG. 1. As the laser beam source 1, there is used a pulse oscillatory high-energy laser such as a KrF excimer laser.

The laser beam emitted from the laser beam source 1 is transmitted through the attenuator 2 and the beam profile modulation portion 3 which can modulate a power and a beam profile. As a result, the power and the beam profile are modulated. Thereafter, the laser beam reaches the moving stage 7. The semiconductor substrate 5 is arranged on the moving stage 7. Laser crystallization is carried out by irradiating the laser beam to the semiconductor substrate 5. The beam profile measurement portion 6 which can measure a beam profile and be also used as a power meter is provided on the moving stage 7. This apparatus works with the measurement personal computer 8. A height z of the moving stage 7 and parameters (e.g., an angle of the attenuator 2, a position of the phase shifter 31, a gap d in case of the proximity type and others) of the optical systems which can modulate a power and a beam profile are set in order to obtain a preferred beam profile.

Figure 9A:
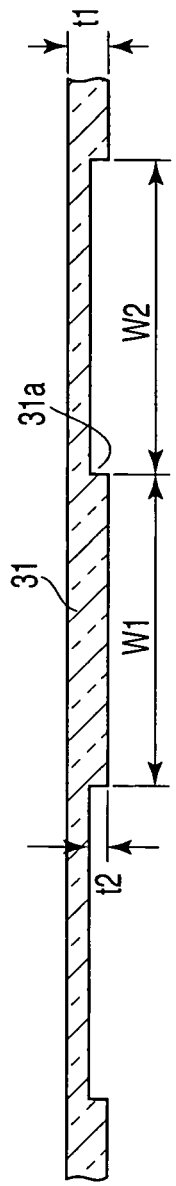
FIGS. 9A, 9B and 9C are a cross-sectional view schematically showing a part of a phase shifter, a beam profile characteristic diagram formed by using the phase shifter, and an SEM image representing a repeated pattern of a crystallized structure grown in the lateral direction by irradiation of laser beam having a profile.
Figure 9B:
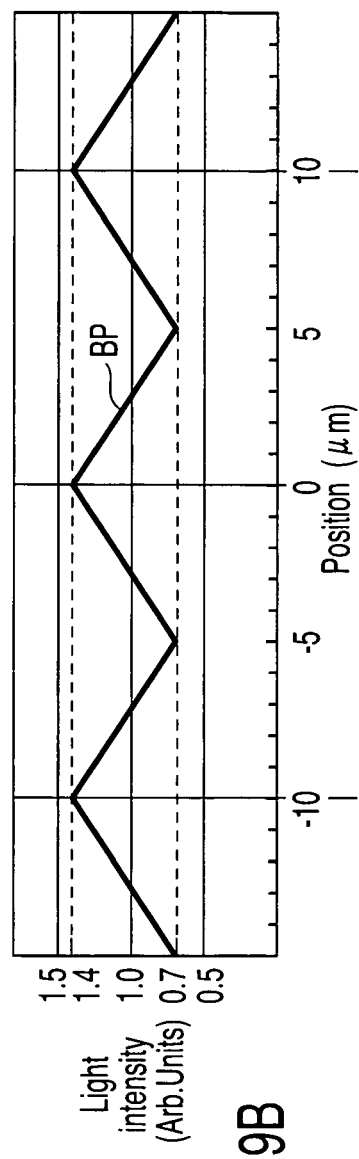
Figure 9C:
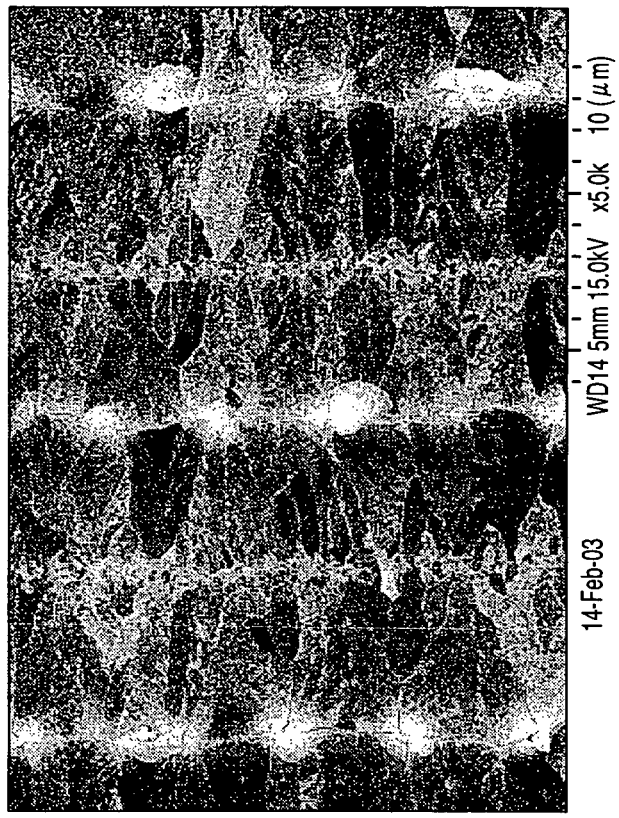

A beam profile BP shown in FIG. 9B is a beam profile with which an area of a crystal with a large crystal grain size can be formed. Conditions of this beam profile BP are set by using a system which works with the measurement personal computer 8. FIG. 9C shows a scanning type electronic microscope picture of a resulting structure. In this case, it was found that setting an average laser beam intensity J to 0.8 $J/cm^2$, JL=0.5 $J/cm^2$ and JB=0.9 $J/cm^2$ with a gap d=60 μm as the profile required to manufacture a TFT.

A crystal area manufactured by these methods is patterned and subjected to the following process.

Figure 4B:
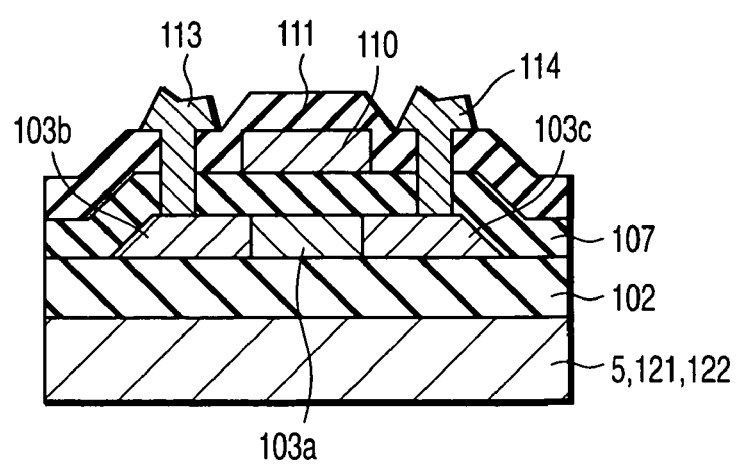

As shown in FIG. 4B, a gate electrode 110 (e.g., high-density phosphor-doped polysilicon, W, TiW, $WSi_2$, $MoSi_2$) is provided on the gate insulating film 107. Ion implantation is carried out with the gate electrode 110 being used as a mask, and a source area 103b and a drain area 103c are respectively formed. For example, as to ion implantation, p+ is implanted in the $10^{15}$ $cm^{-2}$ order in case of an N type TFT, and $BF^{2+}$ is implanted in the $10^{15}$ $cm^{-2}$ order in case of a p type TFT. Thereafter, annealing is performed at 500° C. to 600° C. for about one hour in an electric furnace with nitrogen as a carrier gas, and impurities are activated. Moreover, heating may be effected at 700° C. for only one minute by rapid thermal annealing (RTA). A channel area 103a crystallized by the above-described method exists between the source area 103b and the drain area 103c.

At last, an interlayer insulating film 111 is formed, contact holes are formed, and a metal is filled in the contact holes by a metal CVD film formation method, thereby forming a source electrode 113 and a drain electrode 114. As a material of the source electrode 113 and the drain electrode 114, e.g., Al/TiN is used.

Figures 7A, 7B:
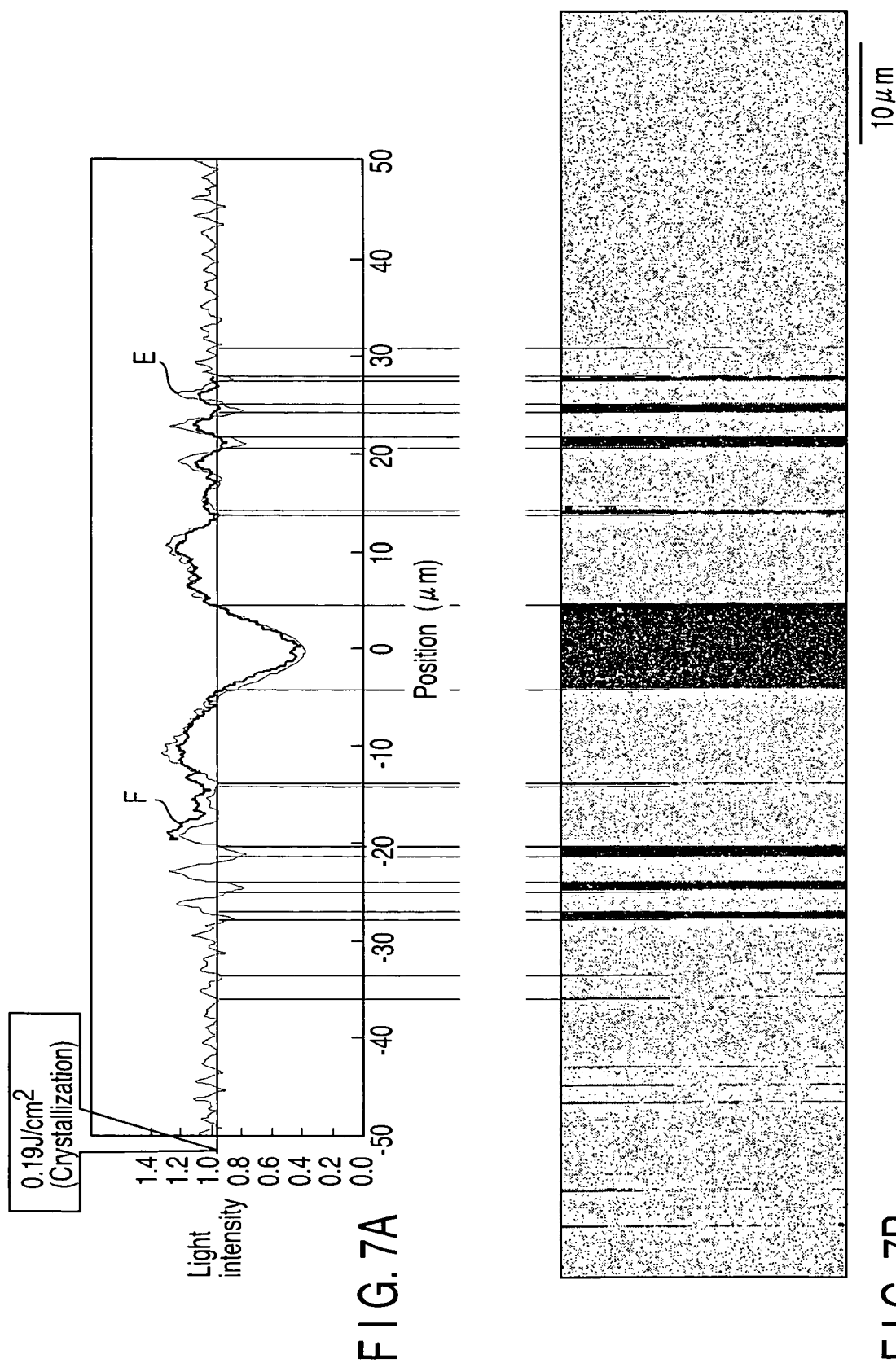
FIG. 7A is a beam profile characteristic diagram showing both a simulation result and an actual result concerning crystallization.
FIG. 7B shows an SEM image representing amorphous Si and crystal Si in a laser irradiation area.

FIG. 7A is a characteristic diagram showing a profile formed by multi-beams obtained by a homogenizer with a horizontal axis representing a distance (μm) from the laser optical axis a and a vertical axis representing a standardized laser intensity index (no unit). The standardized intensity index on the vertical axis is a parameter which can be a benchmark of crystallization, and the index is converged to 1.0 as a result of averaging. It is to be noted that a part with the intensity index being 1.0 corresponds to a laser fluence of 0.2 $J/cm^2$ in FIG. 7A, and 0.19 $J/cm^2$ of a critical light intensity for multi-crystallization can be obtained by irradiating this laser fluence by a coefficient 0.95.

In the drawing, a characteristic line E (thin line) represents a simulation result, and a characteristic line F (heavy line) represents an actual measurement result. The excellent matching of the actual measurement result and the simulation result was obtained except a high spatial frequency component due to the finite number of beams.

FIG. 7B shows a film morphology obtained by crystallization under a low average light intensity condition. A sample has an Si structure of an $SiO_2$ cap film with a thickness of 300 nm/an a-Si film with a thickness of 200 nm/an $SiO_2$ film with a thickness of 1000 nm at a substrate temperature ° C. Positions at which multi-crystallization occurs (low parts) are positions with a locally high light intensity, and positions with a locally low light intensity (black parts) are uncrystallized areas. The black parts are well matched with positions lower than a line (intensity index: 0.95) indicated by 0.19 $J/cm^2$ on the characteristic line E in FIG. 7A. A critical light intensity with which multi-crystallization occurs is approximately 0.19 $J/cm^2$, and this value is the same as that in case of homogeneous beam irradiation.

Figure 8A:
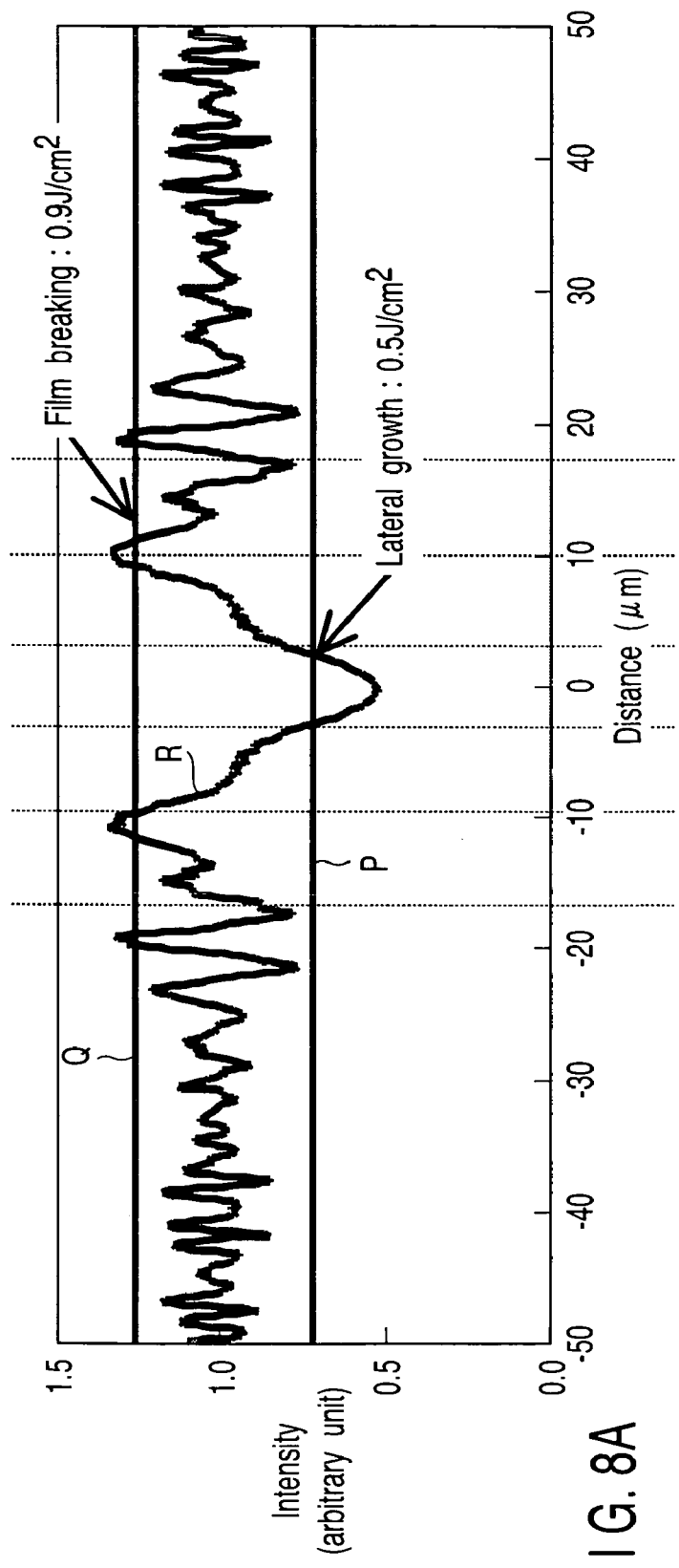
FIG. 8A is a characteristic diagram showing a relationship between lateral growth, film breaking and a laser fluence.

In FIG. 8A, a horizontal axis represents a distance (μm) from the laser optical axis a and a vertical axis represents a standardized laser intensity index (no unit). This drawing is a characteristic diagram showing a relationship with a laser fluence about whether crystallized Si grows in the lateral direction or whether the laterally grown crystal film is broken due to an excessive contractive force. A characteristic line P in the drawing is a critical line of lateral growth. An Si crystal grows in the lateral direction in an area above this line, and it does not grow in the lateral direction in an area below this line. A characteristic line Q is a critical line of film breaking. A Si crystal film is broken due to an excessive contractive force in an area above this line, and the Si crystal film is not broken in an area below this line. Laser fluence conversion values obtained by multiplying indices of the both characteristic lines P and Q by a coefficient are approximately 0.5 J/cm$^2$ and approximately 0.9 J/cm$^2$, respectively. A characteristic line R corresponds to a beam profile of a laser beam intensity. When the characteristic line R exists in an area sandwiched between the both characteristic lines P and Q, stable lateral growth is enabled without producing film breaking. Additionally, it was also revealed that a distance which enables growth with a single shot is approximately 7 microns.

Figure 8B:
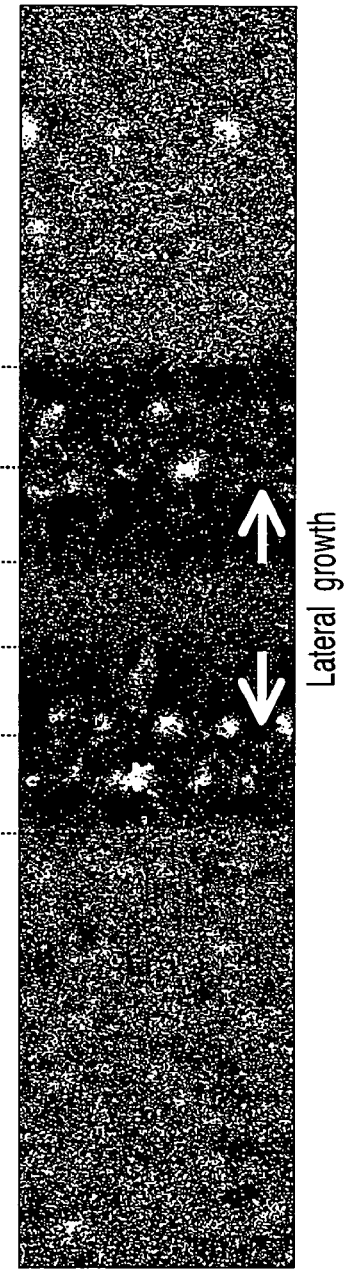
FIG. 8B shows an SEM image of an Si thin film in a lateral growth process.

FIG. 8B shows an SEM image of an Si thin film in the lateral growth process. The laterally grown Si crystal can be observed in a range of 10 μm or less on each side from the laser optical axis a. However, irregularities in laser intensity are large in an area of 10 μm or more on each side from the laser optical axis a, and a structure subjected to film breaking (white blocks dotted in the drawing) can be observed. Further, an area in the vicinity of the laser optical axis a remains in the amorphous state without being crystallized due to insufficiency of an intensity of the laser fluence, and this area does not grow in the lateral direction.

An optical system which can form a large crystal grain (average diameter 5 microns) with a high filling factor was obtained by using the above-described experimental result. FIGS. 9B and 9C respectively show an obtained light intensity distribution and film morphology. A vertical axis in FIG. 9B represents a standardized laser intensity (no unit) which is a parameter as a benchmark for crystallization. The standardized laser intensity converges on 1.0 when averaged. In a beam profile BP in FIG. 9B, a maximum value of the light intensity is determined as 1.4 whilst a minimum value of the light intensity is determined as 0.7, and there is provided a pattern in which a decrease and an increase are monotonously repeated at equal pitch intervals of 5 μm.

FIG. 9C shows an SEM image (20 μm×20 μm) showing a partially enlarged repeated pattern in a laser beam irradiation (J=0.76 J/cm$^2$) area. It was observed that Si crystal grains stably laterally grow to a distance of 5 μm on each side from the laser optical axis a. Based on this, large crystal grains with a grain size of approximately 5 μm were evenly formed with a high filling factor on the entire beam irradiation area (0.24 mm×0.24 mm).

Figure 5A:
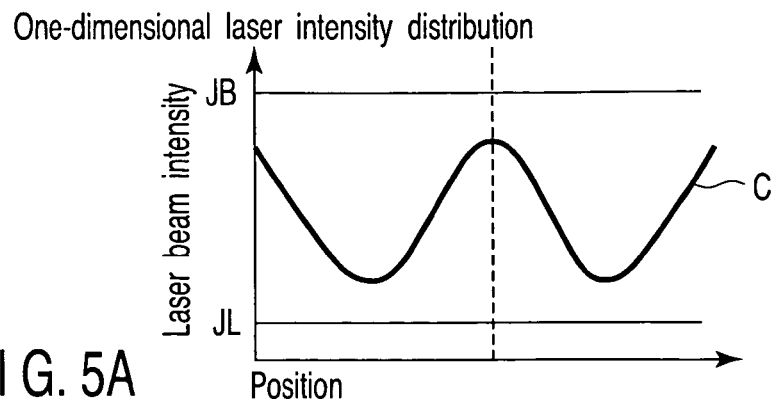
FIG. 5A is a view showing a beam profile C.
Figure 5B:
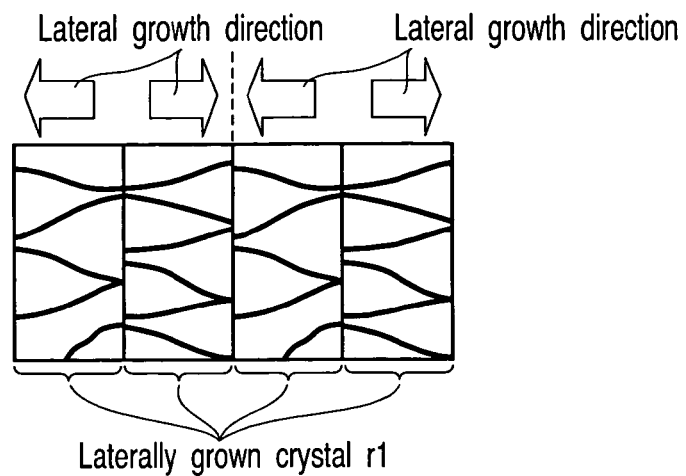
FIG. 5B is a plan view schematically showing a crystallized structure formed by irradiation of laser beam having the beam profile C.

It is possible to adopt a sinusoidal waveform shown in FIG. 5A and a triangular wave shown in FIG. 9B as well as various waveforms for the beam profile BP according to the present invention. For example, it is possible to use, e.g., a chevron continuous wave shown in FIG. 10A, a trough continuous wave shown in FIG. 10B, and a saw-tooth waveform shown in FIG. 10C. It may be a mixed triangular waveform shown in FIG. 10D in which a large triangular waveform with a relatively large amplitude and a small triangular waveform with a relatively small amplitude are alternately repeated. It may be a waveform in which jagged triangular waveforms are superposed along a chevron envelope curve shown in FIG. 10D. It may be a twin-peak waveform having two peaks shown in FIG. 10F. As described above, in the beam profile BP according to the present invention, it is possible to use various modified waveforms as long as the waveform is a V-shaped continuous wave or a U-shaped continuous wave having a monotonous increase waveform portion and a monotonous decrease waveform portion.

Figure 10A:
FIGS. 10A to 10F are views respectively showing modifications of the beam profile.
Figure 10B:
Figure 10C:
Figure 10D:
Figure 10E:
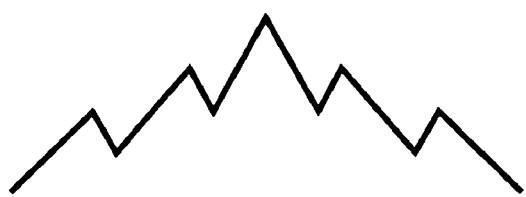
Figure 10F:

It is to be noted that the sinusoidal waveform described in FIG. 5A, the triangular waveform shown in FIG. 9B, the chevron continuous waveform shown in FIG. 10A, the trough continuous waveform described in FIG. 10B and others correspond to irradiation light beam which is monotonously increased and monotonously decreased with the same amplitude in the same cycle. Further, the sinusoidal waveform shown in FIG. 5A, the triangular waveform described in FIG. 9B, the chevron continuous wave shown in FIG. 10A and the trough continuous wave illustrated in FIG. 10B are symmetrical waveforms.

The triangular waveform shown in FIG. 9B and the waveforms of the light intensity distribution in which the waveforms are monotonously increased and monotonously decreased shown in FIGS. 10C, 10D, 10E and 10F have a linear shape and a triangular shape.

In order to obtain crystallized grains with a large grain size, it is important for a switching portion from the monotonous increase waveform to the monotonous decrease waveform to have a waveform with a gradient in both the V-shaped and U-shaped continuous waveforms. If a flat waveform exists in the switching portion, the crystal grain is broken or crystallization in the lateral direction stops in that portion. Furthermore, in order to obtain crystallized grains with a large grain size, it is important for a switching portion from the monotonous decrease waveform to the monotonous increase waveform to have a waveform with a gradient in both the V-shaped and U-shaped continuous waveforms. If a flat waveform exists in the switching portion, an area of multi-crystal grains is generated or crystallization in the lateral direction becomes insufficient in that portion.

When the switching portion from the monotonous increase waveform to the monotonous decrease waveform or the switching portion from the monotonous decrease waveform to the monotonous increase waveform has a gradient, a flat waveform does not exist in the switching portion.

Properties of the excimer laser beam were extracted by a high-resolution beam profiler. As a result, it is possible to design a light intensity distribution on a sample surface. Furthermore, an optical system which allows large crystal grains to grow with a high filling factor was designed by evaluating various kinds of critical optical intensities and synthesizing results of the evaluation. This effectiveness was confirmed by an experiment.

Figure 11:
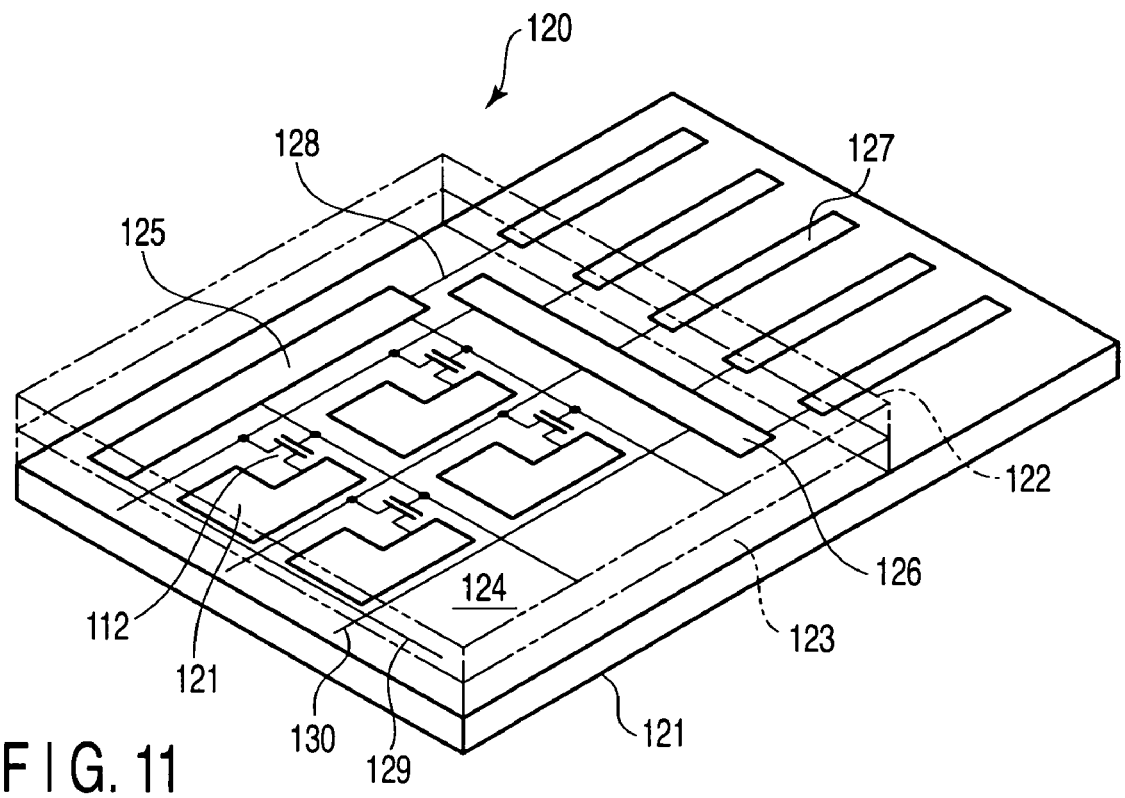
FIG. 11 is a schematic perspective view of a display apparatus.
Figure 12A:
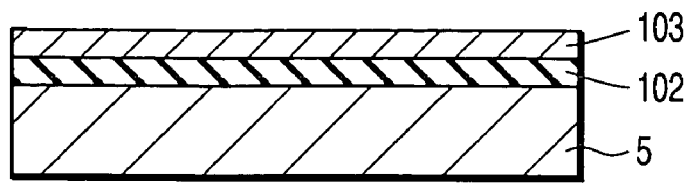
FIGS. 12A to 12D are cross-sectional type drawings illustrating steps when manufacturing a semiconductor element.
Figure 12B:
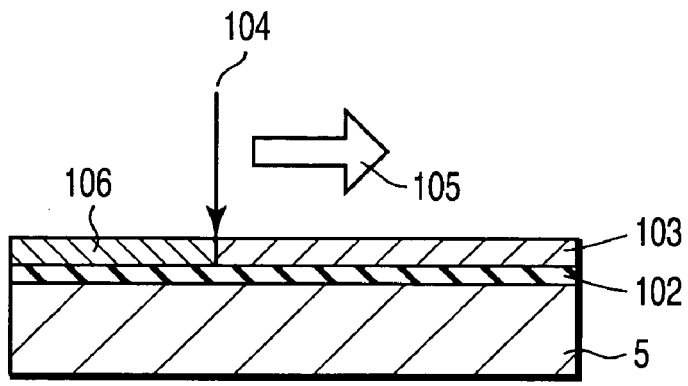
Figure 12C:
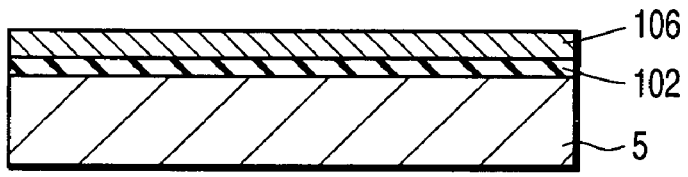
Figure 12D:
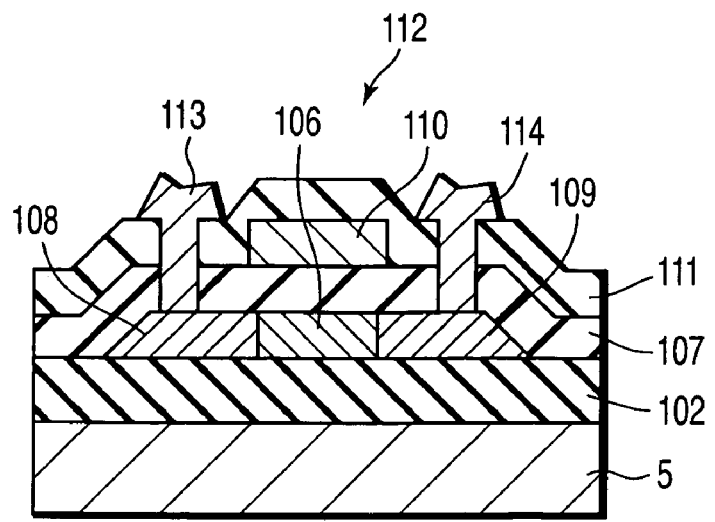

FIG. 11 shows an example of an active matrix type display apparatus using a thin film transistor. The thin film transistor 112 is manufactured through steps shown in FIGS. 12A to 12D. As shown in the drawings, this display apparatus 120 has a panel structure including a pair of insulating substrates 121 and 122 and an electro-optic substance 123 held therebetween. As the electro-optic substance 123, a liquid crystal material is extensively used. A pixel array portion 124 and a drive circuit portion are integrated and formed on the lower insulating substrate 121. The drive circuit portion is separated into a vertical drive circuit 125 and a horizontal drive circuit 126.

Terminal portions 127 for external connection are formed at an upper end of a peripheral portion of the insulating substrate 121. The terminal portions 127 are connected with the vertical drive circuit 125 and the horizontal drive circuit 126 through wirings 128. Row gate wirings 129 and column signal wirings 130 are formed to the pixel array portion 124. A pixel electrode 131 and a thin film transistor 112 which drives this electrode are formed at each intersection of the both wirings. This thin film transistor 112 is manufactured by using the above-described method (see FIG. 4). A gate electrode 110 of the thin film transistor 112 is connected with a corresponding gate wiring 129. A drain area 103c is connected with a corresponding pixel electrode 131 through a drain electrode 113, and a source area 103b is connected with a corresponding signal wiring 130 through a source electrode 114. The gate wiring 129 is connected with the vertical drive circuit 125 and, on the other hand, the signal wiring 130 is connected with the horizontal drive circuit 126.

The thin film transistor 112 which drives the pixel electrode 131 to be switched and the thin film transistor included in the vertical drive circuit 125 and the horizontal drive circuit 126 are manufactured in accordance with the present invention, and have the higher mobility than that in the prior art. Therefore, it is possible to integrate and form not only the drive circuits but also a processing circuit with higher performances.

Figure 15:
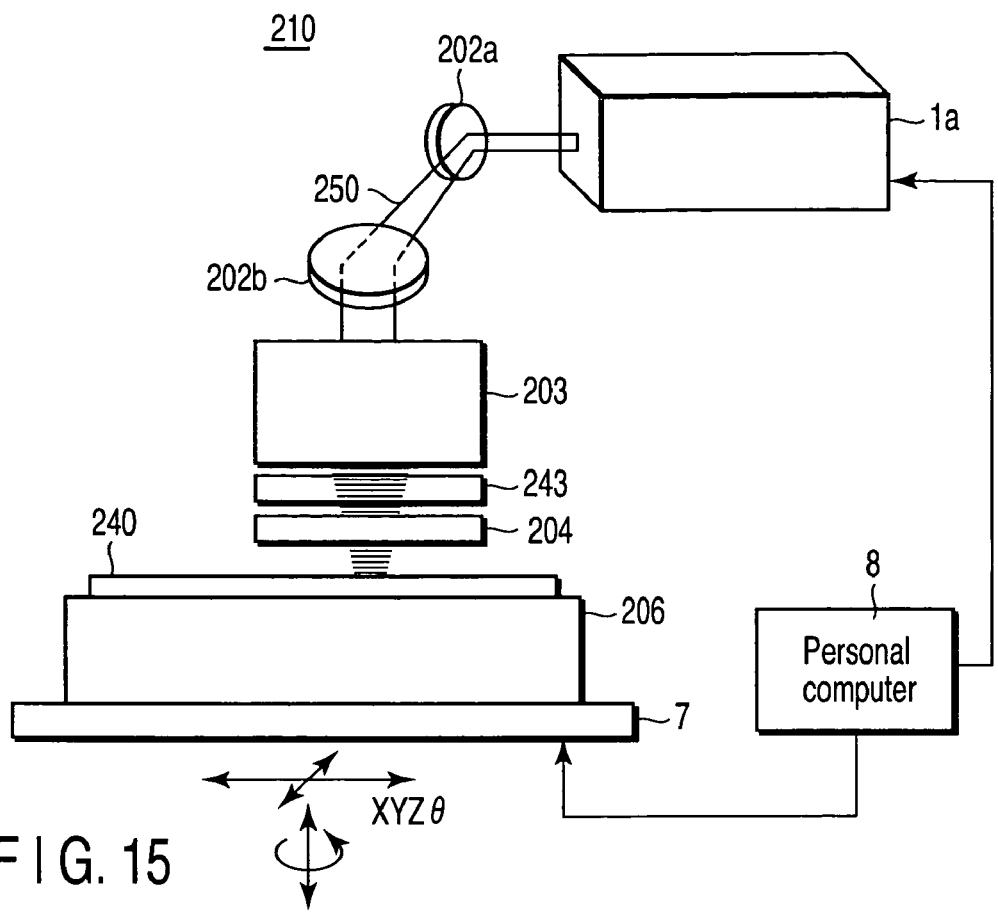
FIG. 15 is a structural block diagram showing an outline of a crystallization apparatus according to the present invention.

Any other preferred embodiment according to the present invention will now be described hereinafter. In FIGS. 13 to 31, like reference numerals denote like portions, thereby eliminating their detailed explanation. The detailed explanation will be eliminated if it is tautological. As shown in FIG. 15, in a crystallization apparatus 210, pulse laser beam 250 emitted from a KrF excimer laser beam source 1a is irradiated to a processed substrate 240 on a mount base 206 through optical systems 202a and 202b, a homogenizer 203, an image formation optical system 243 and a phase shifter 204 sequentially provided in a light path of the laser beam in order to carry out crystallization. A power supply circuit of the KrF excimer laser device 1a is connected with an output portion of a personal computer 8 in such a manner that an output signal of the personal computer 8 can be supplied. The personal computer 8 controls emission timing, a pulse width, a pulse interval, a magnitude of an output or the like of the laser beam 250.

The optical system in this apparatus is constituted by arranging, e.g., a concave lens 202a, a convex lens 202b, the homogenizer 203, the phase shifter 204 and others on the same optical axis. This crystallization apparatus 210 is a proximity type optical system.

The optical system will now be concretely described with reference to FIG. 16. FIG. 16 is a block diagram of the proximity type optical system. It includes a KrF excimer laser beam source 1a which emits excimer pulse laser beam having a wavelength of, e.g., 248 nm as the pulse laser beam source 1a. It is to be noted that any other beam source such as an XeCl excimer pulse laser beam source or a YAG laser beam source can be used as this beam source 1a. The laser beam emitted from the beam source 1a is expanded through the optical systems 202a and 202b formed of a beam expander 202, and then enter the first fly-eye lens 233.

A plurality of beam sources are formed on a rear focal plane of the first fly-eye lens 233, and light fluxes from the plurality of beam sources illuminate an incident plane of a second fly-eye lens 235 through a first condenser optical system 234 in a superposing manner. As a result, more beam sources are formed on a rear focal plane of the second fly-eye lens 235 than the beam sources on the rear focal plane of the first fly-eye lens 233. Light fluxes from the beam sources formed on the rear focal plane of the second fly-eye lens 235 illuminate a phase modulation optical system 204 (phase shifter) through a second condenser optical system 236 in a superposing manner.

Here, the first fly-eye lens 233 and the first condenser optical system 234 constitute a first homogenizer, and this first homogenizer achieves homogenization concerning a light intensity on the phase shifter 204.

Further, the second fly-eye lens 235 and the second condenser optical system 236 constitute a second homogenizer, and this second homogenizer achieves homogenization concerning a light intensity (laser fluence) at each in-plane position on the phase shifter 204. In this manner, the illumination system irradiates the phase shifter 204 with light beam having a substantially homogeneous light intensity distribution (light intensity distribution).

The homogenizer 203 includes a function to level the pulse laser beam in a beam irradiation area. A light intensity of the pulse laser beam 250 which has passed through the homogenizer 203 are homogenized. The homogenizer 203 is an optical system to homogenize the pulse laser beam 250 in regard to a light intensity.

Figure 13A:
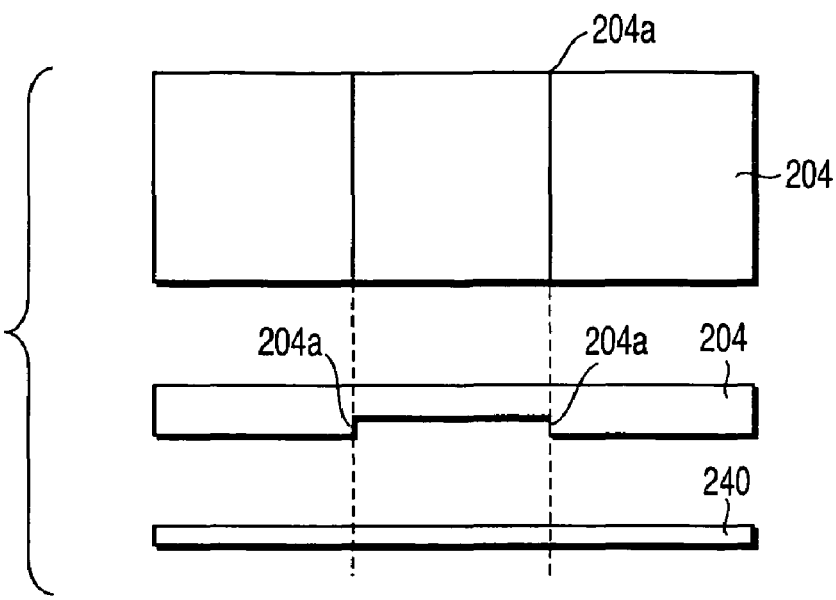
FIGS. 13A, 13B and 13C are a view showing a phase shifter and a substrate, a view showing a light intensity distribution of homogenized laser beam transmitted through the phase shifter, and a view three-dimensionally showing a light intensity distribution of the laser beam.
Figure 13B:
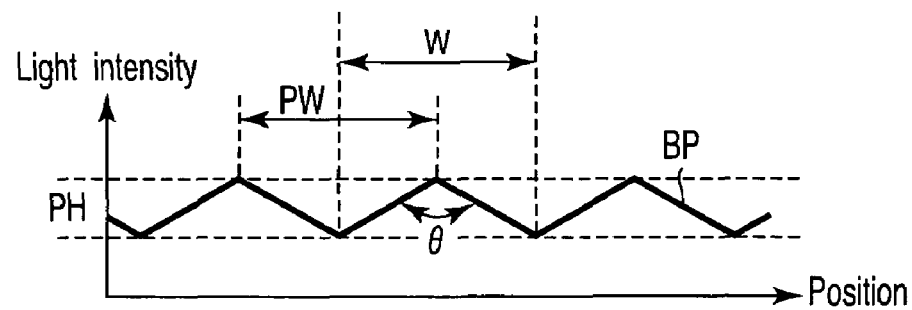
Figure 13C:
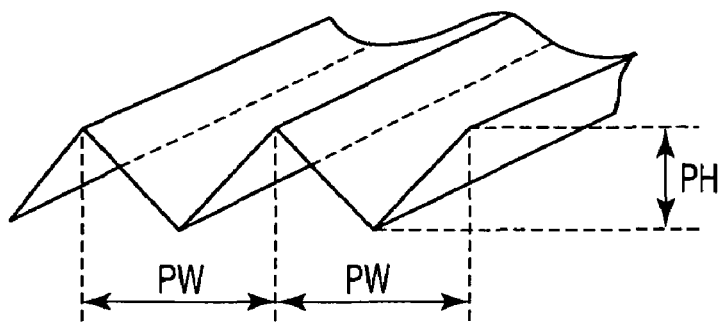

A phase of the homogenized pulse laser beam 250 is modulated by the phase shifter 204. For example, the phase shifter 204 is of an in-plane-cross-coupled type having a plurality of linear steps 204a which are aligned in parallel with each other, and it is also a proximity type crystallization apparatus which is arranged in close proximity to the processed substrate 240 on the mount base 206. The phase shifter 204 is formed of a transparent material, and generates a phase difference in the pulse laser beam 250 at the steps 204a. The phase shifter 204 generates diffraction in the pulse laser beam 250 by using the phase difference, and modulates a light intensity of the pulse laser beam 250. As a result, the phase shifter 204 forms in the beam irradiation portion a light intensity distribution BP having a repetition pattern which repeats a monotonous increase and a monotonous decrease as shown in FIG. 13B. It is to be noted that a gap W between the steps 204a and 204a of the phase shifter 204 is set to 100 μm in this embodiment. In the proximity type crystallization apparatus, an excellent thermal storage effect is outputted when a film thickness of a cap film 253 which is used to increase a grain size is not less than 30 nm and not more than 500 nm. In the proximity type crystallization method, therefore, an optimum film thickness of the cap film 253 is not less than 30 nm and not more than 500 nm.

On an upper surface of the processed substrate is provided, e.g., the cap film 253. A mutual distance from this cap film 253 to the phase shifter 204 is set to a predetermined interval which is, e.g., not more than 500 μm. The mount base 206 and peripherals other than the mount base 206 do not include a substrate heating mechanism (e.g., a built-in heater).

The mount base 206 is mounted on an XYZθ stage 7, movable in X axis and Y axis directions in a horizontal plane, movable in a Z axis direction orthogonal to the horizontal plane, and θ-rotatable around a Z axis. A power supply circuit of the XYZθ stage 7 is connected with the output portion of the personal computer 8. To the XYZθ stage 7 are provided an X axis drive mechanism, a Y axis drive mechanism, a Z axis drive mechanism and a θ-rotation drive mechanism, and the XYZθ stage 7 is controlled in X, Y, Z and θ directions, respectively. It is to be noted that the above example corresponds to the crystallization method based on the proximity type optical system, but it may be a crystallization method based on a projection type optical system. In the projection type crystallization method, an optimum film thickness of the cap film 253 is not less than 80 nm and not more than 400 nm.

A description will now be given as to a crystallization method based on the proximity type crystallization apparatus 210 described in FIG. 15. Pulse laser beam having a pulse width of, e.g., 30 nsec and a light intensity of, e.g., 1 J/cm² is emitted from the pulse laser beam source 1a. The pulse laser beam is diffused and converged by the concave lens 202a and the convex lens 202b, thereby being caused to enter the homogenizer 203. The homogenizer 203 homogenizes an incident angle and a light intensity of the entered pulse laser beam 250.

The homogenizer 203 causes the homogenizes pulse laser beam 250 to enter the phase shifter 204, and the phase shifter 204 emits pulse laser beam having a light intensity distribution of an inverse peak pattern with an inverted-triangular cross section. Maximum and minimum values of the inverse peak pattern with the inverted-triangular cross section are designed to values defined by a type or a film thickness of a non-single-crystal semiconductor film. The homogenized pulse laser beam having the light intensity distribution of the inverse peak pattern with the inverted-triangular cross section enters the amorphous silicon film 252, melts and crystallizes only a beam irradiation portion thereof. Since the amorphous silicon film 252 is thin, it immediately melts in a thickness direction at its beam irradiation portion, a drop in temperature at the melted part starts with an inverse peak point where a fluence becomes minimum being determined as a starting point, and solidification (crystallization) starts. This solidification position sequentially moves in accordance with a gradient of the inverse peak pattern with the inverted-triangular cross section. With this movement of the solidification point, a crystal grain grows in a lateral direction (direction orthogonal to the thickness of the amorphous silicon film 252). As to this lateral growth of the crystal grain, since the temperature drop gradient is maintained for a long time by the thermal storage effect of the cap film 253, crystallization is facilitated. Therefore, a size of the crystal grain after final solidification is increased, and a single-crystallization in a wide range is realized in the beam irradiation portion.

Such a crystallization step is carried out in a predetermined area of the amorphous silicon film 252. Means for effecting the crystallization step on the entire surface can be carried out by relatively moving the stage 7 and an irradiation position obtained by the pulse laser beam source 1a.

Figure 17:
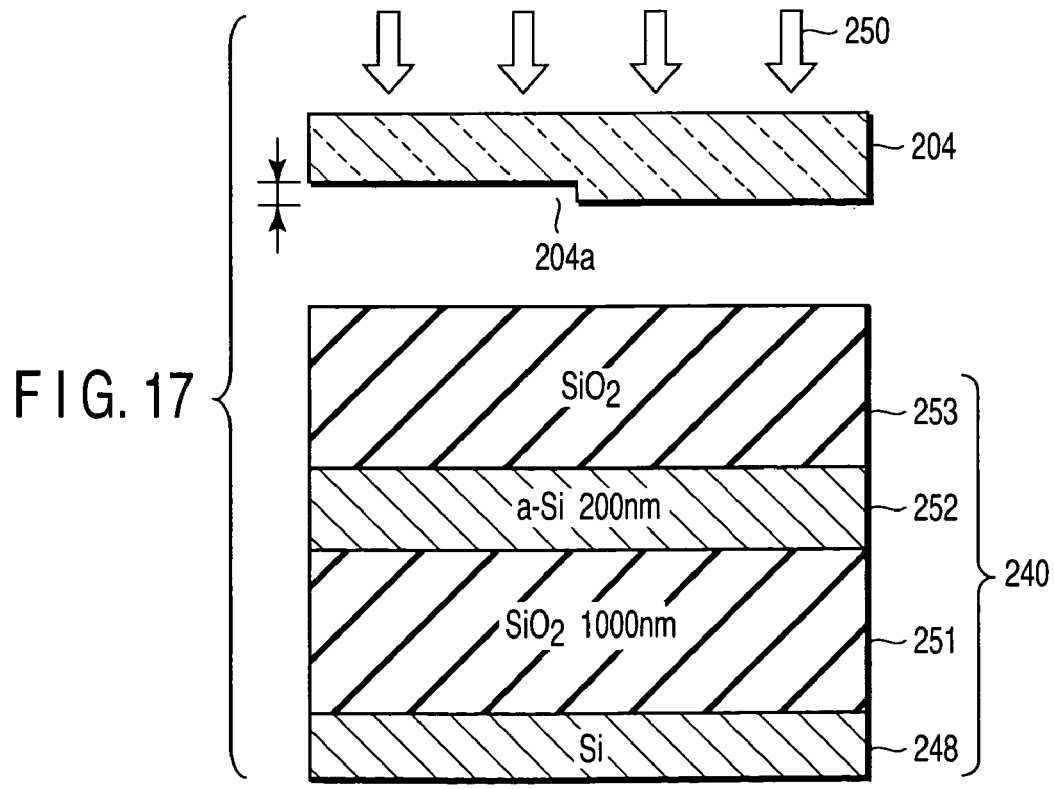
FIG. 17 is a cross-sectional type drawing illustrating a laminated structure associating with present invention.

Phase-modulated pulse laser beam by using the proximity type crystallization apparatus 210 shown in FIG. 15 was irradiated on one surface of the processed substrate 240 in order to crystallize the amorphous silicon film 252. The processed substrate 240 is obtained by forming a silicon oxide film as the cap film 253 as shown in FIG. 17. That is, the processed substrate 240 is a structure obtained by sequentially laminating insulating layers, e.g., an underlying protective film 251, an amorphous silicon film 252 and a cap film 253 on a base substance formed of an insulator or a semiconductor, e.g., a silicon substrate 248. The underlying protective film 251 is composed of a first insulating layer such as an $SiO_2$ film with a film thickness of, e.g., 1000 nm. The amorphous silicon film 252 is a film as a target of crystallization, and composed of amorphous silicon with a film thickness of, e.g., 200 nm. The cap film 253 is a second insulating layer which is an insulative $SiO_2$ film with a film thickness of, e.g., 300 nm.

A method for manufacturing such a processed substrate 240 with the cap film 253 to be subjected to crystallization processing will now be concretely described.

A silicon substrate 248 was used as a base substance formed of an insulator or a semiconductor, and the underlying protective film 251 formed of an $SiO_2$ film with a film thickness of 1000 nm was formed by a thermal oxidation method.

An amorphous semiconductor film or a non-single-crystal semiconductor, e.g., the amorphous silicon film 252 (e.g., an amorphous Si film with a film thickness of 200 nm formed by a plasma chemical vapor deposition method) is formed on the underlying protective film 251.

A second insulating layer, e.g., an $SiO_2$ film (e.g., an $SiO_2$ film with a film thickness of 300 nm formed by the plasma chemical vapor deposition method using $SiH_4$ and $N_2O$) was formed as the cap film 253 on the amorphous silicon film 252. Then, dehydrogenation processing was executed with respect to the thin films 251 to 253 formed on the silicon substrate 248. It is desirable to perform this processing in a temperature area of 500 to 600° C., and heating processing was carried out in a nitrogen atmosphere at 570° C. for two hours, for example.

FIG. 18 is a photograph showing an SEM image of the Si thin film crystallized under the room temperature condition by the method according to this embodiment of the present invention. As apparent from observation of the SEM image, it was confirmed that Si crystals with a crystal grain size increased by lateral growth are generated in a range of 4 to 5 μm on each side from a laser optical axis (center in the picture). Furthermore, it was confirmed that the laterally grown Si crystals excellently extend in the lateral direction with the crystal nucleus at the center as a starting point and they are densely aligned.

The Si crystals with a crystal grain size increased by lateral growth were obtained by moving the substrate in parallel by only a predetermined pitch distance after irradiation of one shot of the laser beam and irradiating a next short of the laser beam to the substrate. By repeating the same operations, element formation areas of the amorphous silicon film were sequentially crystallized.

FIGS. 19 to 21 show crystallization characteristics when the phase shifter 204 is arranged in the proximity type crystallization apparatus 210 described in FIG. 15 and one shot of pulse beam from the excimer laser is irradiated to the processed substrate 240 at a room temperature. In FIG. 19, a horizontal axis represents a film thickness (nm) of a silicon oxide film ($SiO_2$) as the cap film 253, and a vertical axis represents a lateral growth distance (μm) of the crystallized crystal grain. It is a characteristic view showing a result of examining a cap film dependency of the lateral growth distance while changing the film thickness of the silicon oxide film as the cap film 253 in many ways with respect to various kinds of samples. It is to be noted that an average value was obtained as the lateral growth distance. Here, an acceptability criterion is that the lateral growth distance is not less than 4.0 μm in relation to the positioning accuracy of the crystal and a channel portion of the transistor.

As shown in FIG. 19, in the embodiment, when the film thickness of the cap film 253 is not less than 30 nm and not more than approximately 340 nm in the proximity type crystallization apparatus, the lateral growth distance which is not less than 4 μm on the maximum level was obtained at a room temperature. Furthermore, even if the film thickness of the cap film 253 is 30 nm and 80 nm, the lateral growth distance of approximately 3 μm and 2 μm on the maximum level was obtained. Moreover, even if the film thickness of the cap film 253 is 390 nm, the lateral growth distance of approximately 1.5 μm on the maximum level was obtained. On the other hand, when the film thickness of the cap film 253 is 480 nm, the lateral growth distance was lower than 1.5 μm. A crystallized area having a large grain size with the lateral growth distance being not less than 5 μm was obtained when the film thickness of the cap film 253 is not less than 100 μm and not more than 340 μm. This film thickness of the cap film 253 is a film thickness with which crystallization with a large grain size can be obtained when the non-single-crystal semiconductor film irradiated with the laser beam through the phase shifter 204 is heated and a temperature drop speed of the non-single-crystal semiconductor melted by heating is decreased. In order to decrease the temperature drop speed, an appropriate thickness is selected for the cap film 253 (second insulating layer), and a light energy and an intensity distribution BP of the laser beam used for crystallization are appropriately selected.

In FIG. 20, a horizontal axis represents a temperature (° C.) of the processed substrate 240, and a vertical axis represents a lateral growth distance (μm) of a crystallized crystal grain. The phase shifter 204 was arranged in the proximity type crystallization apparatus 210 as shown in FIG. 15. This drawing is a characteristic view showing a result of examining a substrate temperature dependency of the lateral growth distance while changing a temperature of the processed substrate 240 having the cap film 253 formed of an $SiO_2$ film with a film thickness 300 nm as the cap film 253 in many ways. As apparent from the drawing, in the processed substrate 240 having the cap film 253 formed of $SiO_2$ with a sufficient thickness as the cap film 253, a substrate temperature substantially does not have the substrate temperature dependency of the lateral growth distance from a room temperature to several-hundred ° C. It was revealed that the lateral growth distance with a sufficient length can be obtained even at the room temperature. Although not clear, it can be considered that this phenomenon occurs due to the thermal storage effect of the cap film.

In FIG. 21, a horizontal axis represents a light intensity index (relative quantity), and a vertical axis represents a lateral growth distance (μm) of a crystallized crystal grain. This drawing is a characteristic view showing a result of examining a light intensity index dependency of the lateral growth distance while changing a light intensity of the laser beam in many ways with respect to various kinds of samples with the phase shifter 204 being arranged in the proximity type apparatus as shown in FIG. 15. As apparent from the drawing, it was found that the lateral growth distance is suddenly increased in the vicinity of a point where the light intensity exceeds 0.9 in terms of the relative quantity. Specifically, the large lateral growth distance which is not less than 4 μm was obtained by irradiation of one shot of the pulse beam from the excimer laser to the processed substrate at a room temperature.

In this specification, the "light intensity index" means a value of a light intensity with respect to a reference which is an energy beam irradiation intensity with which morphological characteristics of a film (crystal structure) is barely maintained without breaking the film even under various kinds of stresses during or after growth of a crystal grain. Based on the above, it was confirmed that a large crystal grain (average crystal grain size: not less than 4 μm) is allowed to grow in the lateral direction with a high filling factor at a room temperature by using the method according to the present invention.

Although the description has been given on an example in which the phase shifter 204 is arranged in the proximity type apparatus in the foregoing embodiment, the phase shifter 204 may be arranged in a projection type apparatus as shown in FIG. 22. That is, this projection type crystallization apparatus 210A is an apparatus in which an image formation optical system 243 is arranged between the phase shifter 204 and the processed substrate 240.

A description will now be given as to an embodiment which crystallizes an Si film by phase modulation excimer laser annealing (which will be abbreviated as PMELA hereinafter) utilizing the projection type crystallization apparatus 210A. As shown in FIG. 17, in regard to the processed substrate 240, the underlying protective film 251 formed of $SiO_2$ with a film thickness of 1000 nm is first formed on the silicon (Si) substrate 240 by a thermal oxidation method. Thereafter, there is obtained a laminated structure in which the amorphous silicon film 252 with a film thickness of 200 nm and the $SiO_2$ film 253 as the cap film 253 are sequentially superimposed by a PE-CVD (Plasma Enhanced-CVD) method. Further, the underlying protective film 251, the amorphous Si film 252 and the cap film 253 may be formed by continuous film formation based on the PE-CVD (Plasma Enhanced-CVD) method. Before PMELA, dehydrogenation processing was carried out in a nitrogen gas atmosphere for two hours at 550° C. in an annealing furnace.

In PMELA, a single shot of KrF excimer laser beam with a pulse width of, e.g., 30 nsec was irradiated to the processed substrate 240. Micro-structural analysis of the crystallized Si film was executed by using a scanning type electronic microscope (SEM) after Secco-etching. FIG. 14B shows an example of the scanning type electronic microscope (SEM) image representing a sample crystallized by irradiating a single shot of pulse laser beam using a light intensity distribution BP while changing a pitch width PW in many ways. When the pitch width PW was changed in many ways and its limit was examined, a lower limit of the pitch width PW is restricted by its optical resolution and it was 0.001 nm (1 μm). Furthermore, as to the upper limit, although lateral growth was confirmed when examined about 800 μm, 900 μm and 1000 μm, lateral growth was not confirmed in case of 1005 μm. Therefore, a distance of one cycle of the light intensity distribution which cyclically repeats the monotonous increase and the monotonous decrease must fall within a range of 0.001 mm to 1 mm.

Figure 24:
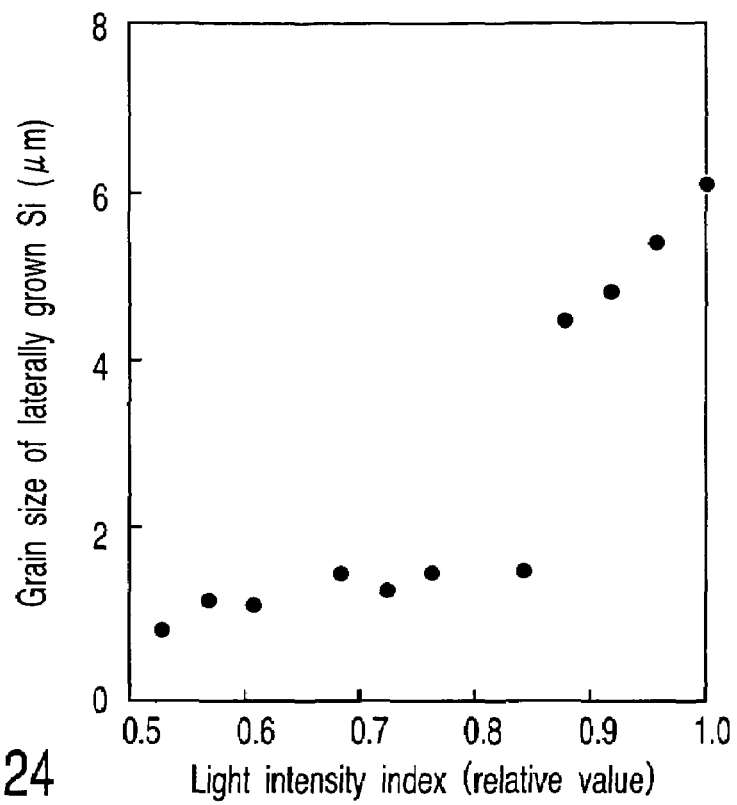
FIG. 24 is a characteristic view showing the effect of the present invention.

FIGS. 23 and 24 show crystallization characteristics when the crystallization step of the processed substrate 240 is carried out by using the projection type crystallization apparatus 210A.

FIG. 23 is a characteristic view showing a result of examining a relationship between a lateral growth distance and a film thickness of the cap film 253 when the phase shifter 204 as the phase modulation optical system is arranged in the projection type crystallization apparatus 210A as shown in FIG. 22. That is, in FIG. 23, a horizontal axis represents a thickness (nm) of the cap film 253, and a vertical axis represents a lateral growth distance (μm) of a crystal grain. FIG. 23 shows a maximum lateral growth distance at each film thickness of the cap film 253. Moreover, a curve in the drawing connects the lateral growth distances at respective cap film thicknesses. As apparent from FIG. 23, the lateral growth distance is also increased when the thickness of the cap film 253 is increased, and the lateral growth distance exceeded 4 μm when the film thickness of the cap film 253 falls within a range of 130 to 400 nm. In particular, when the thickness of the cap film 253 is 250 nm, the lateral growth distance reached approximately 7 μm on the maximum level. As shown in FIG. 24, in this embodiment, the large lateral growth distance not less than 6 μm was obtained when the pulse beam from the excimer laser was irradiated to the processed substrate 240 at a room temperature.

It is to be noted that FIG. 23 shows the lateral growth distance of a sample, e.g., a non-single-crystal semiconductor film when the cap film 253 is not provided by a black circle as reference data. The lateral growth distance of the non-single-crystal semiconductor film without the cap film 253 was shorter than the lateral growth distance of the non-single-crystal semiconductor film with the cap film 253.

In FIG. 24, a horizontal axis represents a light intensity index (relative value) and a vertical axis represents a lateral growth distance (μm) in a sample of the amorphous silicon film 252 with a film thickness of 200 nm. This drawing is a characteristic view showing a result of examining a relationship between a lateral growth distance of a crystal grain and a light intensity when the phase shifter 204 is arranged in the projection type apparatus as shown in FIG. 22. As apparent from the drawing, it was confirmed by the projection method that the lateral growth distance is suddenly increased when the light intensity exceeds 0.9 as a relative quantity.

Then, in the processed substrate 240 having the cap 253 shown in FIG. 17, the crystallization step was carried out while changing a film thickness of the amorphous silicon film 252, and a relationship with a maximum lateral growth distance was observed.

Figure 33:
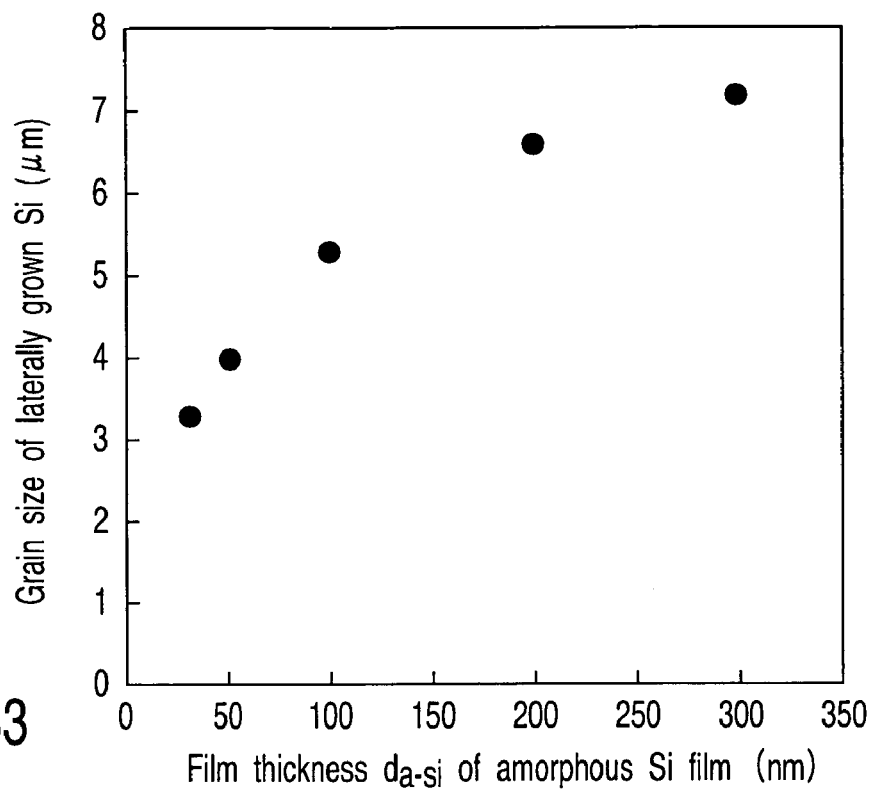
FIG. 33 is a characteristic view showing a relationship between a film thickness (nm) of an amorphous silicon film and a lateral growth distance (μm) of crystal grains.

FIG. 33 is a characteristic view showing a relationship between the film thickness of the amorphous silicon film 252 and the maximum lateral growth distance. In cases where the cap film 253 is not provided, the maximum lateral growth distance was 2.5 μm when the film thickness of the amorphous silicon film 252 is 200 nm as shown in FIGS. 19 and 23. As shown in FIG. 32, however, in the processed substrate 240 having the cap film 253 described in FIG. 17, even if the film thickness of the amorphous silicon film 252 is as thin as, e.g., 30 nm, a laterally grown crystal grain which is not less than 3 μm can be obtained. It was found that providing the cap film 253 is effective for a length of the maximum lateral growth distance from the results shown in FIGS. 19, 23 and 33.

Additionally, FIG. 33 shows that the maximum lateral growth distance becomes long when the film thickness of the amorphous silicon film 252 is increased, and that extension of the maximum lateral growth distance is saturated when the film thickness of the amorphous silicon film 252 becomes approximately 200 nm.

Figure 34:
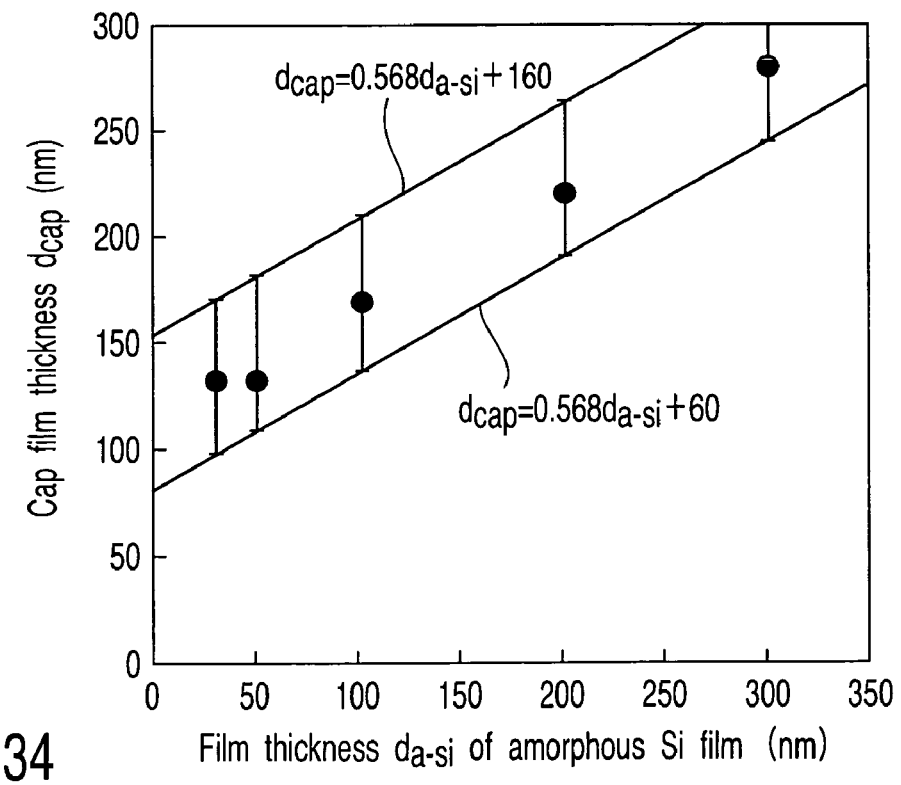
FIG. 34 is a characteristic view showing a relationship between a film thickness (nm) of an amorphous silicon film and a film thickness (nm) of a cap film.

A description will now be given as to a condition of a cap film thickness which achieves the maximum lateral growth distance described in FIG. 33. FIG. 34 is a characteristic view showing a relationship between a film thickness $d_{a\text{-}Si}$ of the amorphous silicon film 252 and a film thickness $d_{cap}$ of the cap film 253 which achieves the maximum lateral growth distance. As a result, it was found that the necessary film thickness $d_{cap}$ of the cap film 253 becomes large as the film thickness $d_{a\text{-}Si}$ of the amorphous silicon film 252 is increased. FIG. 34 shows that a heat capacity in the silicon layer 252 is increased as the amorphous silicon film 252 becomes thick, and the thick cap film 253 is required in order to store the increased heat. FIG. 34 is a characteristic view showing a relationship between a film thickness $d_{a\text{-}Si}$ of the amorphous silicon film 252 and a film thickness $d_{cap}$ of the cap film 253. When the film thickness of the cap film 253 is selected to fall within a range surrounded by a straight line $d_{cap}=0.568d_{a\text{-}Si}+60$ and a straight line $d_{cap}=0.568d_{a\text{-}Si}+160$ in accordance with each amorphous silicon film thickness, the maximum lateral crystal growth is enabled at the film thickness $d_{a\text{-}Si}$ of each amorphous silicon film 252. In the above expression, $d_{cap}$ is a film thickness (nm) of the second insulating layer (cap film 253), and $d_{a\text{-}Si}$ is a film thickness (nm) of the amorphous semiconductor film or the non-single-crystal semiconductor film (amorphous silicon film 252).

Figure 25:
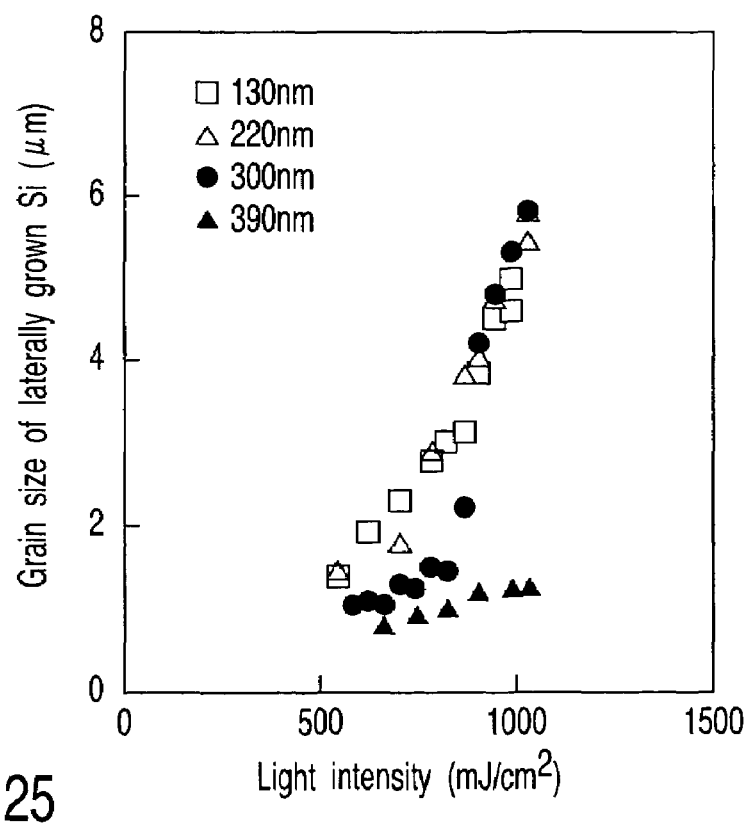
FIG. 25 is a characteristic view showing the effect of the present invention.

A description will now be given as to a result of conducting an empirical test with respect to the thermal storage effect of the cap film 253 with reference to FIGS. 25 to 28. The empirical test was conducted by using a sample with an Si film thickness of 200 nm. FIG. 25 is a characteristic view which has a horizontal axis representing an average light intensity (mJ/cm²) and a vertical axis representing a lateral growth distance (μm) of the crystal grain and shows the thermal storage effect of the cap film 253 when a pitch width PW of the light intensity distribution has a fixed value (28 μm). In the drawing, a white square indicates a result obtained when a thickness of the cap film 253 is set to 130 nm. A white triangle indicates a result obtained when a film thickness of the cap film 253 is set to 220 nm. A black circle indicates a result obtained when a thickness of the cap film 253 is set to 300 nm.

A black triangle indicates a result obtained when a thickness of the cap film 253 is set to 390 nm.

In the thin cap film 253 with a thickness of 130 nm (white square) and a thickness of 220 nm (white triangle), the lateral growth distance of the crystal grain was gradually increased with an increase in light intensity until film breaking occurs. The maximum value of the lateral growth distance at this time was approximately 6 μm. As a result, in case of the cap film 253 with a larger thickness 300 nm (black circle), the lateral growth distance was first increased to approximately 2 μm, and then suddenly increased to exceed 6 μm. On the other hand, in case of the extremely thick cap film 253 with a thickness of 390 nm (black triangle), the lateral growth distance did not exceed 2 μm.

FIGS. 26B and 26C show an SEM image of a silicon film obtained by effecting the crystallization step by irradiating laser beam having a light intensity distribution schematically described in FIG. 26A, and performing Secco-etching. FIG. 26B shows an SEM image of a silicon film when the crystallization step is carried out with a thickness of the cap film 253 being set to 300 nm. An arrow in FIG. 26B indicates a direction of the lateral growth. As a result of microscope observation, a maximum value of the lateral growth distance exceeded 7 μm, and an average value was approximately 6 μm.

FIG. 26C shows an SEM image expressing a crystallization conformation obtained by performing Secco-etching to a sample which has the thick cap film 253. In the drawing, the lateral growth area is divided into several sections by sintered crystal areas. This means that a temperature gradient in the melted amorphous silicon film 252 was able to exist for a relatively long time. However, the temperature was suddenly reduced on a front surface of a solid-fluid interface and became lower than a critical temperature which produces a natural nucleus. The natural nucleus production occurs in the vicinity of the front surface of this solid-fluid interface, and stops the laterally growing crystal grains by mutual collision. At the same time, some new nuclei serve as new lateral growth generation sources. Such a situation often occurs when a temperature gradient in the melted amorphous silicon film 252 is gentle, and it finally brings even small crystal grains. This effect becomes more prominent as the cap film 253 becomes thicker. In case of the very thick cap film 253, since a large part of the heat capacity of the Si layer is used to heat the cap film 253, a period in which a liquid phase of the Si layer exists is reduced.

Furthermore, it is confirmed that there is critical intensity with which the crystal suddenly change in the lateral growth characteristics between the cap film 253 with a thickness of 220 nm and 300 nm.

Figure 27:
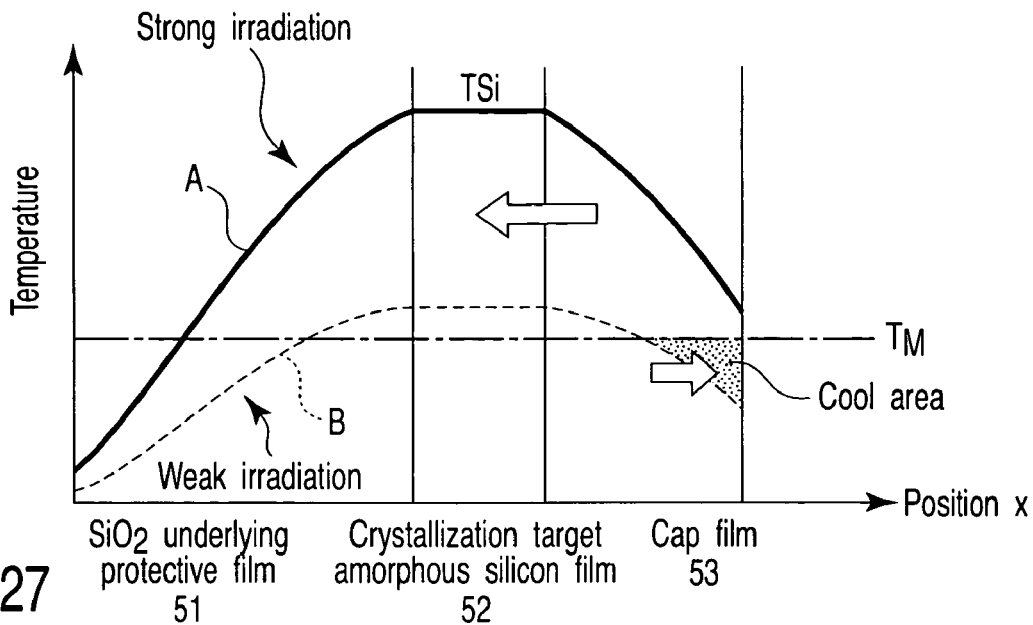
FIG. 27 is a type drawing illustrating an effect of the present invention.

FIG. 27 is a type drawing illustrating this sudden change. In FIG. 27, a horizontal axis represents a position of each film layer on the substrate, and a vertical axis represents a temperature (no unit). This drawing is a one-dimensional temperature distribution diagram showing a temperature distribution in a film thickness direction of the processed substrate in which the amorphous silicon film 252 as a crystallization target is formed on the $SiO_2$ underlying protective film 251 and the $SiO_2$ cap film 253 is formed on this amorphous silicon film 252. Here, it is simplified and assumed that a temperature $T_{Si}$ of the amorphous silicon film 252 as a crystallization target is increased with time during pulse irradiation. At a trailing end of the pulse of the laser beam which is irradiated with pulse, the $SiO_2$ cap film 253 and the underlying protective film 251 have the same temperature distribution shape, but this distribution is in proportion to the temperature $T_{Si}$ of the amorphous silicon film 252 as schematically shown in the drawing. In case of the strong irradiation (solid line A), the temperature $T_{Si}$ of the amorphous silicon film 252 is increased. When the cap film 253 is heated by the temperature $T_{Si}$ of the amorphous silicon film 252, the temperature of the cap film 253 consequently exceeds a melting point TM of the amorphous silicon film 252 which is a crystallization target film in a wide area with respect to the thickness direction. Then, the cap film 253 functions as a heat capacitor.

On the other hand, in case of the weak irradiation (broken line B), the temperature $T_{Si}$ of the amorphous silicon film 252 is not high enough to heat the cap film 253. Only a part of the cap film 253 in the vicinity of the amorphous silicon layer 252 is heated to exceed the melting point TM. Another part of the cap film 253 remains at a low temperature (not more than the melting point TM), and this row-temperature area (cool area) acts as a heat sink.

As a result of an experiment using such a projection type crystallization apparatus as shown in FIG. 22, the thickness of the cap film 253 which is preferable to extend the lateral growth distance fell within a range of 100 to 370 nm.

Figure 28:
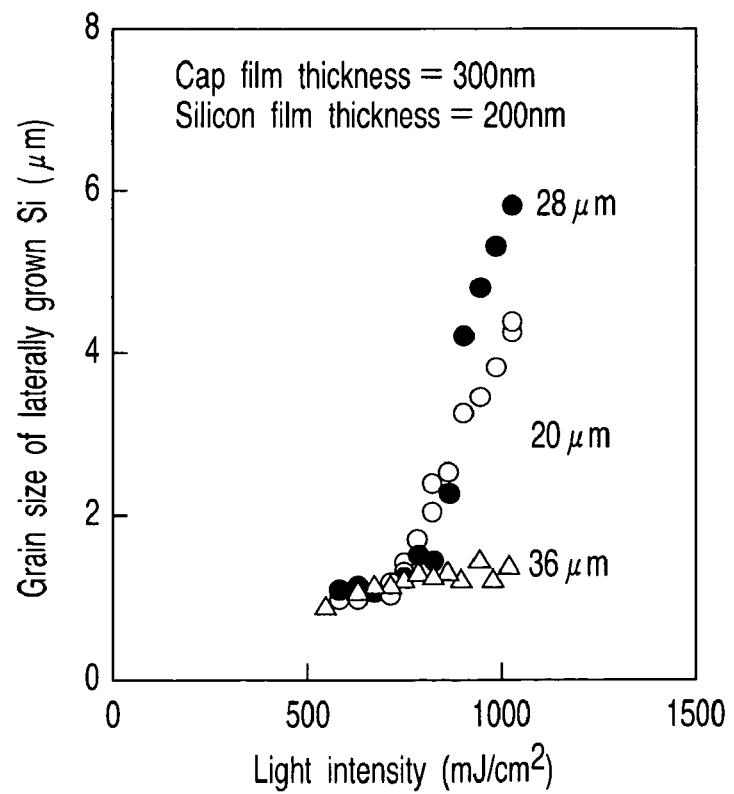
FIG. 28 is a characteristic view showing the effect of the present invention.

In FIG. 28, a horizontal axis represents an average light intensity (mJ/cm$^2$), and a vertical axis represents a lateral growth distance (μm) of the crystal grain. This drawing is a characteristic view showing the thermal storage effect of the cap film 253 when the pitch width PW of the light intensity distribution was changed in many ways with the thickness of the cap film 253 being determined as a fixed value (300 nm). In the drawing, a white circle indicates a result when the pitch width PW is set to 20 μm, a black circle indicates a result when the pitch width PW is set to 28 μm, and a white triangle indicates a result when the pitch width is set to 36 μm, respectively.

As apparent from the drawing, when the pitch width PW is 20 μm, the lateral growth distance was fixedly increased with the light intensity, and reached approximately 4 μm on the maximum level when the light intensity is 100 mJ/cm$^2$. On the other hand, when the pitch width. PW is as large as 36 μm, the lateral growth distance remained as a short distance. Further, when the pitch width PW is 28 μm which is a medium value, the lateral growth distance reached 6 μn through the light intensity which allows sudden growth.

Figure 29A:
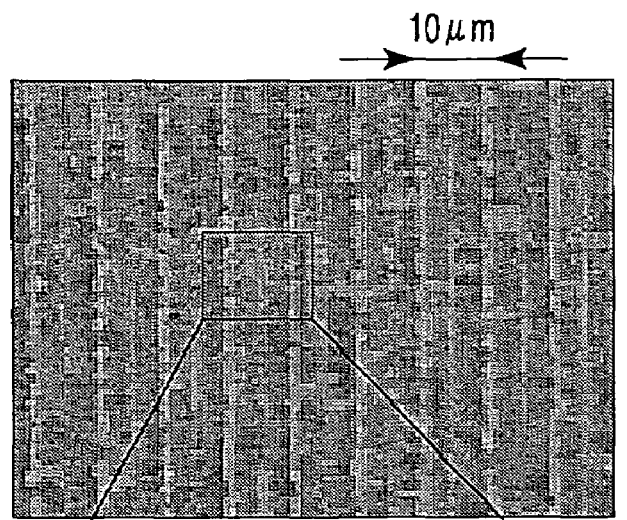
FIG. 29A shows an SEM image of a sample in which large crystal grains are densely arranged.
Figure 29B:
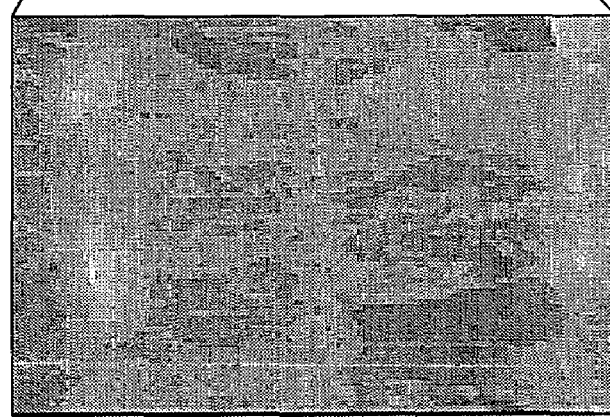
FIG. 29B shows an SEM image showing a part of the sample in FIG. 29A in an enlarged manner.
Figure 29C:
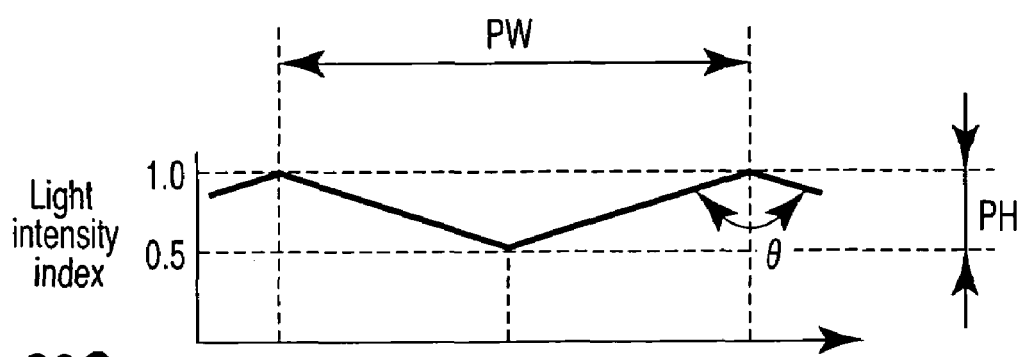
FIG. 29C is a light intensity distribution diagram of laser beam irradiated to the sample described in FIG. 29B.

FIG. 29A shows an SEM image of a sample in which large crystal grains are densely arranged, FIG. 29B shows an SEM image in which the sample of FIG. 29A is partially enlarged, and FIG. 29C shows a light intensity distribution of laser beam irradiated to the sample of FIG. 29B.

It was confirmed from this empirical experiment that a desirable beam profile has a triangular shape in which a ratio of a peak intensity and a trough intensity becomes approximately 2. Such a beam profile is set to be generated by the phase shifter. As shown in FIG. 29A, large crystal grains whose grain size is approximately 5 μm were densely filled on the entire surface of the sample. A conformation similar to the counterpart in which the large crystal grains are densely filled and arranged in this manner was generated with excellent reproducibility.

It is to be noted that the present invention is not restricted to the foregoing embodiments, and constituent elements can be modified and embodied without departing from the scope of the invention on the embodying stage. Furthermore, various inventions can be formed by appropriate combinations of a plurality of constituent elements disclosed in the foregoing embodiments. For example, some constituent elements may be eliminated from all the constituent elements presented in the embodiments. Moreover, constituent element presented in different embodiments may be appropriately combined. Based on this, it was confirmed that the large crystal grains (average crystal grain size: 4.0 to 6 micron) can be allowed to grow in the lateral direction with the high filling factor by using the present invention.

Figure 30:
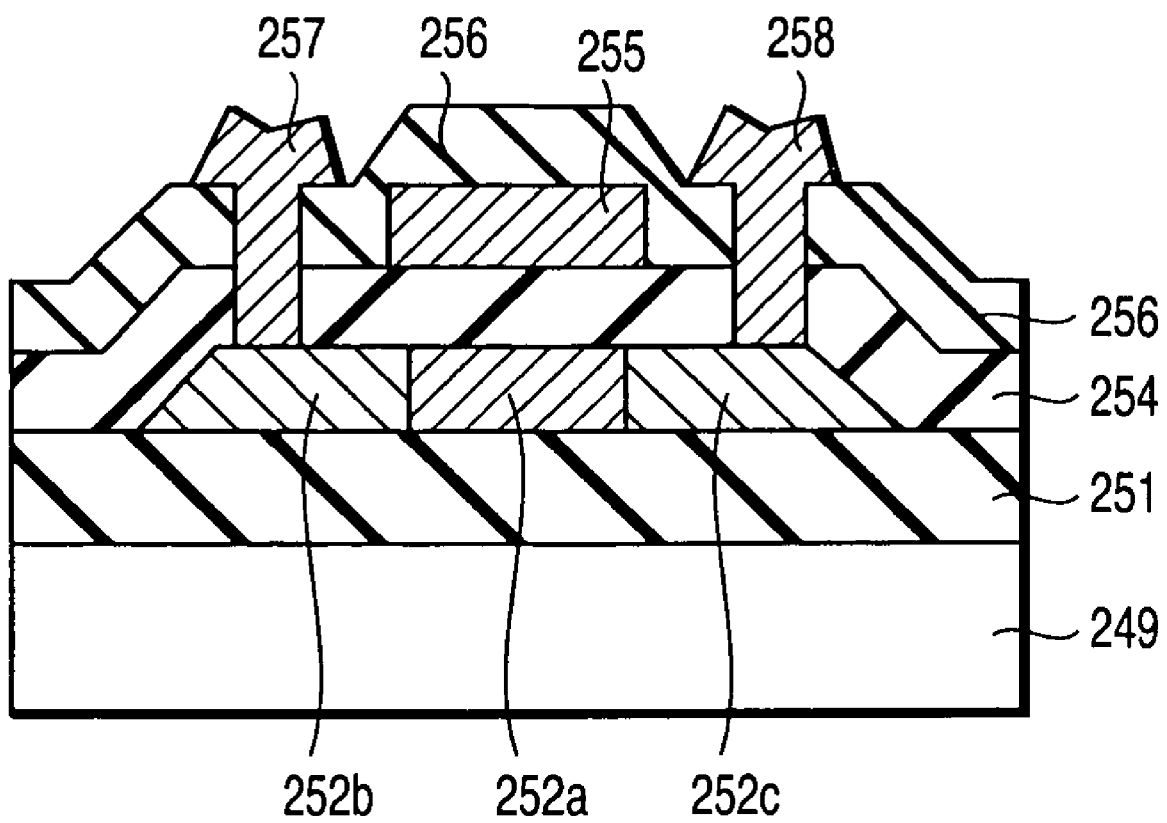
FIG. 30 is a cross-sectional type drawing showing a thin film transistor according to the embodiment of the present invention.

A description will now be given as to a structure of a thin film transistor (TFT) according to the present invention and a manufacturing method thereof with reference to FIG. 30. A thin film transistor was manufactured by utilizing a substrate with a semiconductor film in which large crystal grains are formed by the above-described crystallization method.

As the substrate formed of an insulator or a semiconductor, it is possible to adopt an insulating substrate such as a glass substrate 249, a quartz substrate or a plastic substrate as well as a metallic substrate having an insulating coat formed on a surface thereof, a silicon substrate, a ceramic substrate and others. It is desirable to use a low-alkali glass substrate as typified by, e.g., a #1737 substrate manufactured by Corning as the glass substrate 249. An underlying protective film 251 is an insulating film which contains silicon oxide (SiO$_2$) or silicon nitride as a main component, e.g., a silicon oxide film with a film thickness of 300 nm, and it is preferable to be formed in close contact with the glass substrate 249. The underlying protective film 251 is a film which acts to prevent impurities from being diffused from the glass substrate to the non-single-crystal semiconductor film.

An amorphous semiconductor film or a non-single-crystal semiconductor, e.g., an amorphous silicon film 252 (e.g., an amorphous Si film with a film thickness of 200 nm formed by the plasma chemical vapor deposition method) is formed on the underlying protective film 251.

A cap film 253 is formed on the amorphous silicon film 252, thereby forming a processed substrate 240. As to this processed substrate 240, the crystallization step is carried out by using laser beam 250 obtained by causing pulse laser beam homogenized by the optical system shown in FIG. 16 to enter a phase shifter 204 where phase modulation is effected.

The cap film 253 on the crystallized non-single-crystal semiconductor film is removed by etching. Then, positioning is performed at a crystallized area of the amorphous silicon film 252, and a semiconductor circuit, e.g., a thin film transistor shown in FIG. 30 is manufactured as follows. First, patterning is effected by using the photolithography in order to define a shape of an active area, and an Si island with a predetermined pattern which substantially corresponds to a channel area 252a, a source area 252b and a drain area 252c in a plan view field is formed.

Subsequently, a gate insulating film 254 is formed on the channel area 252a, the source area 252b and the drain area 252c. As to the gate insulating film 254, a silicon oxide film with a thickness of 30 to 120 nm is formed by using a material which contains silicon oxide (SiO$_2$) or silicon oxynitride (SiON). In regard to formation of the gate insulating film 254, the silicon oxide film using SiH$_4$ and N$_2$O as raw materials is formed with a thickness of 50 nm by, e.g., a plasma CVD method, and it is determined as the gate insulating film 254.

Then, an electroconductive layer used to form a gate electrode 255 is formed on the gate insulating layer 254. A material which contains an element such as Ta, Ti, W, Mo, Al or the like as a main component is used, and the electroconductive layer is formed by using a known film formation method such as a sputtering method or a vapor deposition method. For example, Al—Ti alloy is used. A gate electrode metallic layer is patterned by using the photolithography, and a gate electrode 255 with a predetermined pattern is formed.

Then, the source area 252b and the drain area 252c are formed by implanting impurities with the gate electrode 255 being used as a mask. For example, in case of forming a P channel type TFT, P type impurities such as boron ions are implanted by using an ion implantation method. A boron concentration in this area is determined to be, e.g., $1.5 \times 10^{20}$ to $3 \times 10^{21}$. In this manner there is formed a high-concentration p type impurity area constituting the source area 252b and the drain area 252c of the P channel type TFT. It is needless to say that an n channel type TFT is formed by implanting n type impurities at this time.

Then, a heat treatment step to activate an impurity element implanted by the ion implantation method is carried out. This step can be effected by using a method such as a furnace annealing method, a laser annealing method, a rapid thermal annealing method or the like. In this embodiment, the activation step is effected by using the furnace annealing method. It is desirable to perform the heat treatment in a nitrogen atmosphere in a temperature range of 300 to 650° C., and the heat treatment is carried out at 500° C. for four hours in this embodiment. Then, an interlayer insulating film 256 is formed on the gate insulating film 254 and the gate electrode 255. It is good enough to form the interlayer insulating film 256 by using a silicon nitride film, a silicon oxide film and a silicon oxynitride film or a laminated film obtained by a combination of these films. Further, setting its film thickness to 200 to 600 nm can suffice, and it is set to 400 nm in this embodiment.

Then, contact holes are opened at predetermined positions in the interlayer insulating film 256. Furthermore, an electroconductive layer is formed in the contact holes and on the surface of the interlayer insulating layer 256, and it is patterned into a predetermined shape. In this embodiment, there is adopted for source and drain electrode 257 and 258 a laminated film with a three-layer structure obtained by continuously forming a Ti film with a thickness of 100 nm, an aluminium film including Ti with a thickness of 300 nm and a Ti film with a thickness of 150 nm by the sputtering method. In this manner, the thin film transistor shown in FIG. 30 is obtained.

An example in which the thin film transistor obtained in the foregoing embodiment is actually applied to an active matrix type liquid crystal display apparatus has such a structure as shown in FIG. 11. In this case, the thin film transistor 112 is manufactured through the steps illustrated in FIG. 30.

As described above, according to the foregoing embodiment, crystallization with a large grain size can be performed even at a low temperature, e.g., a room temperature or a temperature range in the vicinity thereof (e.g., 5 to 50° C.) during the crystallization processing. Since the phase-modulated light beam is irradiated to the non-single-crystal semiconductor film, higher-order oscillatory components are reduced.

It is to be noted that the present invention is not restricted to the foregoing embodiments, and it can be embodied by modifying constituent elements without departing from the scope of the invention on the embodying stage. Moreover, various inventions can be formed by appropriate combinations of a plurality of constituent elements disclosed in the foregoing embodiments. For example, some constituent elements may be eliminated from all the constituent elements disclosed in the embodiments. Additionally, constituent elements in different embodiments may be appropriately combined.

The present invention can be also applied to an organic electroluminescence display apparatus or an electronic circuit device as well as the liquid crystal display apparatus.

What is claimed is:

1. A projection type crystallization method for a non-single-crystal semiconductor film, comprising:
   homogenizing pulse laser light by making the pulse laser beam incident on a homogenizer, in which the pulse laser beam is transformed into a plurality of light fluxes incident at different angles, and emitting pulse laser beam homogenized in light intensity by these plurality of light fluxes;
   modulating the pulse laser beam by making the plurality of the light fluxes of the different angles incident on a phase modulation optical system including a plurality of phase modulation sections to form a repetitious pattern in which the light intensity of the pulse laser beam homogenized in the homogenizing repeats a monotonous increase and a monotonous decrease, in a light intensity distribution in which maximum peaks of the light intensity of the repetitious pattern are equal to each other and so are minimum peaks, and emitting the modulated pulse laser beam therefrom;
   melting the non-single-crystal semiconductor film of an image-forming region, the image-forming region being formed as the pulse laser beam modulated in the modulating, forms an image on the laser beam incident surface by an image formation optical system; and
   crystallizing the image formation region melted with the pulse laser beam in a lateral direction.

2. The crystallization method according to claim 1, further comprising:
   providing a cap film on the laser beam incident surface of the non-single-crystal semiconductor film, and wherein the crystallizing grows the image-forming region melted with the pulse laser beam into crystals in the lateral direction by a thermal storage effect of the cap film.

3. The crystallization method according to claim 2, further comprising:
   dehydrogenating the non-single-crystal semiconductor film after providing the cap film.

4. The crystallization method according to claim 1, wherein the crystallizing in the lateral direction starts from a location corresponding to the minimum value of the light intensity distribution of the repetitious pattern.

5. The crystallization method according to claim 2, wherein the cap film includes a silicon oxide film and a thickness of the silicon oxide film in a range of not less than 30 nm and not more than 500 nm.

6. The crystallization method according to claim 2, wherein the cap film includes a silicon oxide film and a thickness of the silicon oxide film in a range of not less than 100 nm and not more than 370 nm.

7. The crystallization method according to claim 1, wherein the repetitious pattern comprises an isosceles triangle.

8. The crystallization method according to claim 1, wherein the light intensity of the pulse laser light is, in a relative value, 0.9 or higher and no more than 1.0.

* * * * *